United States Patent
Kobayashi et al.

(10) Patent No.: US 6,787,975 B2
(45) Date of Patent: Sep. 7, 2004

(54) PIEZOELECTRIC DEVICE FOR INJECTOR

(75) Inventors: Masayuki Kobayashi, Kuwana (JP); Shinya Mitarai, Kuwana (JP); Takashi Yamamoto, Chiryu (JP); Hidekazu Hattori, Nagoya (JP)

(73) Assignee: Denso Corporation, Kariya (JP)

( * ) Notice: Subject to any disclaimer, the term of this patent is extended or adjusted under 35 U.S.C. 154(b) by 88 days.

(21) Appl. No.: 09/866,677

(22) Filed: May 30, 2001

(65) Prior Publication Data

US 2002/0005680 A1 Jan. 17, 2002

(30) Foreign Application Priority Data

| May 31, 2000 | (JP) | ................................ | 2000-163233 |
| May 31, 2000 | (JP) | ................................ | 2000-163235 |
| Apr. 26, 2001 | (JP) | ................................ | 2001-130167 |
| Apr. 26, 2001 | (JP) | ................................ | 2001-130169 |

(51) Int. Cl.$^7$ .......................... H01L 41/04; H01L 41/08
(52) U.S. Cl. ..................................... 310/366; 310/328
(58) Field of Search ............................. 310/366, 328

(56) References Cited

U.S. PATENT DOCUMENTS

| 4,553,059 A | * | 11/1985 | Abe et al. ..................... 310/328 |
| 4,675,123 A | * | 6/1987 | Tsunooka et al. ...... 252/62.9 R |
| 4,728,074 A | * | 3/1988 | Igashira et al. ................ 251/57 |
| 4,814,659 A | * | 3/1989 | Sawada ....................... 310/328 |
| 5,466,985 A | * | 11/1995 | Suzuki ........................ 310/333 |
| 5,645,753 A | | 7/1997 | Fukuoka et al. |
| 5,852,337 A | * | 12/1998 | Takeuchi et al. ............. 310/328 |
| 6,239,534 B1 | * | 5/2001 | Takeuchi et al. ............. 310/328 |
| 6,285,116 B1 | * | 9/2001 | Murai et al. ................. 310/328 |
| 6,318,342 B1 | * | 11/2001 | Simon et al. ................. 123/494 |
| 6,462,464 B2 | * | 10/2002 | Mitarai et al. ............... 310/366 |
| 6,483,227 B2 | * | 11/2002 | Murai et al. ................. 310/328 |

FOREIGN PATENT DOCUMENTS

| EP | 0 921 302 A2 | | 6/1999 | |
| JP | 03285374 A | * | 12/1991 | ........... H01L/41/09 |
| JP | 08167746 A | * | 6/1996 | ......... H01L/41/083 |
| JP | 10229227 A | | 8/1998 | |
| JP | 11229993 A | | 8/1999 | |
| JP | 2002054525 A | * | 2/2002 | .......... F02M/51/06 |

OTHER PUBLICATIONS

Hellebrand, et al. "Large Piezoelectric Monolithic Multi-layer Actuators," Siemens AG, Munich, Germany, pp. 119–123.

* cited by examiner

*Primary Examiner*—Burton S. Mullins
*Assistant Examiner*—J. Aguirrechea
(74) *Attorney, Agent, or Firm*—Nixon & Vanderhye P.C.

(57) ABSTRACT

A piezoelectric device 1 for an injector, built into an injector and generating driving force of the injector, wherein a relation $d(0.1\ Ec)/d(1.2\ Ec) \geq 0.50$ is established between an apparent piezoelectric constant $d(1.2\ Ec)$ calculated from static elongation when an electric field of 1.2 Ec is applied to the piezoelectric device in the same direction as a polarizing direction while a preset load of 500 N is applied to the piezoelectric device, and an apparent piezoelectric constant $d(0.1\ Ec)$ calculated from static elongation when an electric field of 0.1 Ec is applied to the piezoelectric device in the same direction as the polarizing direction. The piezoelectric device so fabricated has high durability and can be used for a long time. The piezoelectric device 1 is fabricated by alternately laminating a plurality of piezoelectric layers expanding and contracting in proportion to an applied voltage and a plurality of internal electrode layers for supplying the applied voltage, and the sectional shape of the piezoelectric device crossing at right angles the laminating direction is partially or wholly arcuate. The piezoelectric device 1 is accommodated in a cylindrical accommodation space.

16 Claims, 17 Drawing Sheets

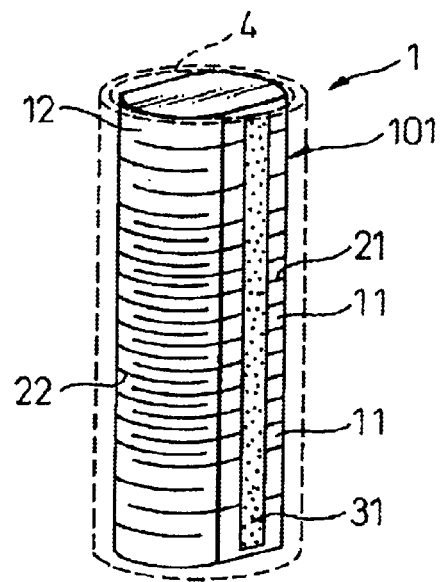
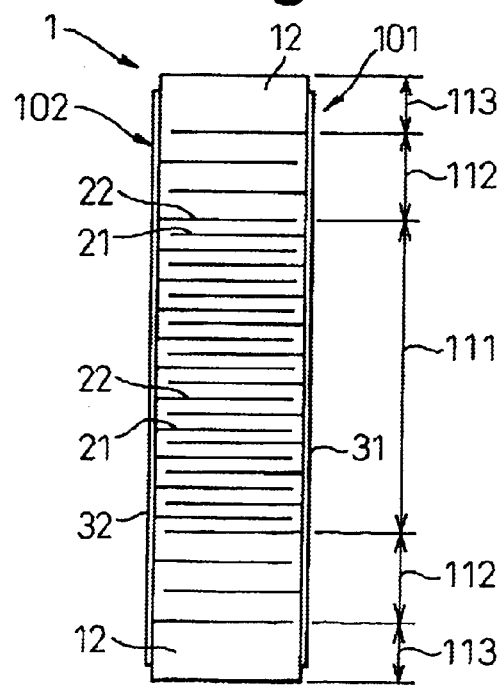

SAMPLE 1

SAMPLE 2

SAMPLE 3

SAMPLE 4

SAMPLE 5

SAMPLE 6

PIEZOELECTRIC DEVICE FOR INJECTOR

BACKGROUND OF THE INVENTION

1. Field of the Invention

This invention relates to a laminate type piezoelectric device used as a driving source of an injector.

2. Description of the Related Art

An injector (fuel injection device) of an internal combustion engine of an automobile, or the like, is constituted in such a fashion that when a valve body of a three-way valve or two-way valve connected to a common rail storing a high-pressure fuel is operated, an open/close state of a fuel passage is changed over to thereby change a pressure condition applied to a nozzle needle, and the nozzle needle is brought into an open state so as to inject fuel.

A solenoid valve has been used ordinarily as a driving source for operating the valve body. Attempts have been made to employ a laminate type piezoelectric device as the driving source so as to finely control the driving source and to precisely control the fuel injection state as described, for example, in Japanese Unexamined Patent Publication (Kokai) No. 11-229993.

However, an injector using the piezoelectric device for the driving source has not yet been put into practical application though proposals have been made as described above.

In the injector, atomization of the fuel must be repeated at an extremely high speed. In cases, atomization is done more than 10,000 times per minute. Therefore, extremely severe conditions are imposed on the piezoelectric device as the driving source when it is used in practice. No piezoelectric device has yet been developed that can be sufficiently used under such severe conditions without inviting cracks, and so forth.

A practical injector must have not only a sufficient driving force but must be small enough to be accommodated in a small accommodation space.

Further, to accommodate the piezoelectric device in the injector, it is effective to accommodate the piezoelectric device into a cylindrical case. When accommodated in this cylindrical space, the piezoelectric device must exhibit excellent dynamic performance (large force generation). When the piezoelectric device is accommodated in the cylindrical accommodation space, the temperature rise resulting from self-exothermy of the piezoelectric device becomes a problem. Therefore, heat radiation performance must also be improved.

SUMMARY OF THE INVENTION

In view of the prior art technologies described above, it is therefore a first object of the present invention to provide a piezoelectric device, for an injector, usable for a long time and having excellent durability when applied to an injector.

It is a second object of the present invention to provide a piezoelectric device, for an injector, capable of providing a large force generation and having excellent heat radiation performance when accommodated in a cylindrical accommodation space.

According to the first aspect of the present invention, there is provided a piezoelectric device for an injector, built in an injector and generating a driving force of the injector, characterized in that the piezoelectric device is fabricated by alternately laminating a plurality of piezoelectric layers generating displacement in proportion to an applied voltage and a plurality of internal electrode layers for supplying the applied voltage and, in the piezoelectric device, a relation $d(0.1\ Ec)/d(1.2\ Ec) \geq 0.43$ is established, where Ec is coercive electric field which causes the changing of polarizing direction, between an apparent piezoelectric constant $d(1.2\ Ec)$ calculated from static elongation when an electric field of 1.2 Ec is applied to the piezoelectric device in the same direction as a polarizing direction while a preset load of 500 N is applied to the piezoelectric device and an apparent piezoelectric constant $d(0.1\ Ec)$ calculated from static elongation when an electric field of 0.1 Ec is applied to the piezoelectric device in the same direction as the polarizing direction.

One noteworthy point in the first aspect of the present invention is that the ratio $d(0.1\ Ec)/d(1.2\ Ec)$ is at least 0.43. When the piezoelectric device generates displacement, there exist a piezoelectric displacement component that immediately starts displacement upon application of a voltage and a 90° rotation component that starts displacement with a delay after the application of the voltage, and they together constitute the overall displacement.

The inventors of the present invention have found that a displacement when an electric field 1.2 times the coercive electric field Ec (the details of which will be explained later) is applied is the sum of the piezoelectric displacement component and the 90° rotation component described above, and a displacement when an electric field 0.1 times the coercive electric field Ec is applied hardly contains the 90° rotation component but almost completely consists of the piezoelectric displacement component.

Therefore, when these apparent piezoelectric constants d are determined, respectively, and their ratio is calculated, the existing ratio of the piezoelectric displacement component contributing to displacement in the piezoelectric device can be determined. In other words, the ratio $d(0.1\ Ec)/d(1.2\ Ec)$ is the value that replaces the existing ratio of the piezoelectric displacement component when the piezoelectric device undergoes displacement.

Here, the present invention sets the value $d(0.1\ Ec)/d(1.2\ Ec)$ to at least 0.43. In this way, the present invention can provide a piezoelectric device in which the existing ratio of the piezoelectric displacement component is higher than the 90° rotation component. Since the ratio of the 90° rotation component is smaller in this case, exothermy of the piezoelectric device due to its repeated displacement can be reduced and, eventually, durability of the piezoelectric device can be improved.

Consequently, the present invention can provide a piezoelectric device that can be used for a long time and has excellent durability when applied to an injector.

According to the second aspect of the present invention, it is more preferable that a relation $d(0.1\ Ec)/d(1.2\ Ec) \geq 0.5$ is established between the piezoelectric constant $d(1.2\ Ec)$ and the piezoelectric constant $d(0.1\ Ec)$.

Next, according to the third aspect of the present invention, there is provided a piezoelectric device for an injector, built into an injector and generating a driving force of the injector, characterized in that the piezoelectric device is fabricated by alternately laminating a plurality of piezoelectric layers generating displacement in proportion to an applied voltage and a plurality of internal electrode layers for supplying the applied voltage; and the piezoelectric device has a change ratio of displacement of 9% or below when a frequency of the applied voltage is changed from 1 Hz to 200 Hz under the state where an AC voltage is applied so that an electric field intensity of 0 to 1.5 kV/mm is generated by a sine wave while a preset load of 500 N is applied to the piezoelectric device.

It is noteworthy in this third aspect that the change ratio of displacement under the condition described above is 9% or below. When the change ratio exceeds 9%, the driving speed of the piezoelectric device cannot be much increased. It is preferable that this change ratio is as small as possible, because, when the change ratio is small, driving can be done at a higher speed. Therefore, according to a fourth aspect of the present invention, it is more preferable that the change ratio is 7% or below.

The change ratio of displacement is expressed by $100 \times (Y_1 - Y_{200})/Y_1$ where $Y_1$ is displacement when the frequency of the applied voltage is 1 Hz and $Y_{200}$ is displacement when the frequency is 200 Hz.

The value of displacement is calculated at 5 seconds after the voltage application.

Next, the function and effect of the third or fourth aspect will be explained.

In the piezoelectric device according to the third aspect of the present invention, the change ratio of displacement described above is 9% or below, or 7% or below. In other words, displacement does not much drop even when the frequency of the applied voltage is increased. Sufficient displacement can be acquired even when the frequency is increased to increase the driving speed. Therefore, the driving speed of the piezoelectric device of this invention can be increased stably. Even when the number of times of fuel injection is 10,000 per minute, the piezoelectric device can repeat displacement (expansion and contraction) with a margin.

Accordingly, the piezoelectric device according to the third or fourth aspect of the present invention can exhibit excellent durability when applied to the injector and can be used for a long time.

According to the fifth aspect of the present invention, there is provided a piezoelectric device for an injector, built into an injector and generating a driving force of the injector, characterized in that the piezoelectric device is fabricated by alternately laminating a plurality of piezoelectric layers generating displacement in proportion to an applied voltage and a plurality of internal electrode layers for supplying the applied voltage; and in the piezoelectric device, displacement increases with the rise of temperature within the range of −40° C. to 150° C.

It is noteworthy in the fifth aspect that displacement increases with the rise of the temperature within the specific temperature range described above.

Next, the function and effect of the fifth aspect will be explained.

In the injector using the piezoelectric device, a displacement loss resulting from an increase in a fuel leak due to a drop in the fuel viscosity and a displacement loss resulting from a drop in a volume elastic modulus of the fuel occur, so that necessary displacement of the piezoelectric device increases with a temperature rise.

To offset the change of necessary displacement, a control circuit for correcting the change becomes necessary. However, correction by means of a circuit invites the increase of the scale of the control circuit.

In contrast, the piezoelectric device according to the fifth aspect has the feature in that displacement increases with the temperature rise. Therefore, a control circuit for controlling this displacement may well have a relatively simple structure and a relatively small size.

For this reason, the piezoelectric device of the fifth aspect can be easily applied to the injector.

According to the sixth aspect of the present invention, the increase ratio of displacement within the range of temperature of −40° C. to 150° C. is preferably from 5 to 40%. In this case, the increase of necessary displacement with the temperature rise can easily be compensated for.

The change ratio of displacement is expressed by $100 \times (Y_{150} - Y_{-40})/Y_{-40}$ where $Y_{-40}$ is displacement at −40° C. and $Y150$ is displacement at 150° C.

According to the seventh aspect of the present invention, there is provided a piezoelectric device for an injector, built into an injector and generating a driving force of said injector, characterized in that the piezoelectric device is fabricated by alternately laminating a plurality of piezoelectric layers generating displacement in proportion to an applied voltage and a plurality of internal electrode layers for supplying the applied voltage, and the piezoelectric device has a dielectric loss of 8% or below calculated from a P-E hysteresis.

It is noteworthy in this seventh aspect that the piezoelectric device has a dielectric loss of 8% or below determined from a P-E hysteresis. In a graph in which an electric field intensity E is plotted on the abscissa and a charge P, on the ordinate, the P-E hysteresis can be obtained by plotting the trajectory of the value of the charge P when the field intensity is increased up to 1.5 kV/mm and is then lowered (see later-appearing embodiments).

When the dielectric loss determined from this P-E hysteresis exceeds 8%, exothermy becomes so high that the driving speed cannot be increased much. Therefore, according to an eighth aspect of the present invention, it is more preferable that the dielectric loss is 7% or below. Incidentally, the dielectric constant determined from the P-E hysteresis is preferably as small as possible because exothermy can then be suppressed.

Next, the function and effect of the seventh or eighth aspect will be explained.

The piezoelectric device according to the seventh or eighth aspect of the present invention has a dielectric loss of 8% or below, or 7% or below determined from the P-E hysteresis as described above. Therefore, as will be illustrated in the later-appearing embodiments, exothermy of the piezoelectric device can be suppressed even when the piezoelectric device is driven at a high speed, and the durability can be remarkably improved.

In consequence, the piezoelectric device according to the seventh or eighth aspect of the present invention exhibits excellent durability when applied to an injector, and can be used for a long time.

According to the ninth aspect of the present invention, there is provided a piezoelectric device for an injector, built in an injector and generating a driving force of the injector, characterized in that the piezoelectric device is fabricated by alternately laminating a plurality of piezoelectric layers expanding and contracting in proportion to an applied voltage and a plurality of internal electrode layers for supplying the applying voltage, and has an octagonal sectional shape crossing, at right angles, the laminating direction, and the piezoelectric device is accommodated in a cylindrical accommodation space.

It is noteworthy, in the ninth aspect of the present invention, that the piezoelectric device is built and accommodated in the cylindrical accommodation space, and its sectional shape is an octagon or a polygon with a larger number of sides than the octagon.

Since the piezoelectric device has a sectional shape of the octagon or a polygon with a larger number of sides than the octagon, the sectional area of the piezoelectric device, when accommodated in the cylindrical accommodation space, can be increased much more than when the sectional area is a polygonal with lower than eight sides, such as a square or a hexagon, and the accommodation space can be effectively utilized. Therefore, the piezoelectric device of this embodiment can increase the generation force that depends on the sectional area.

When the sectional shape is an octagon or a polygon with a larger number of sides than the octagon, proximity can be increased between the cylindrical accommodation space encircling the piezoelectric device and the piezoelectric device. In other words, portions having a small distance between the piezoelectric device and the cylindrical accommodation space increase or in other words, the space decreases, and heat from the piezoelectric device can be more efficiently transferred to the cylindrical accommodation space. Therefore, when the piezoelectric device generates heat itself, the resulting heat can be easily radiated from the cylindrical accommodation space.

Therefore, the ninth aspect can provide a piezoelectric device, for an injector, that can provide a large force generation and has excellent heat radiation performance when it is accommodated in the cylindrical accommodation space.

According to the tenth aspect of the present invention, there is provided a piezoelectric device for an injector, built in an injector and generating a driving force of the injector, characterized in that the piezoelectric device is fabricated by alternately laminating a plurality of piezoelectric layers expanding and contracting in proportion to an applied voltage and a plurality of internal electrode layers for supplying the applied voltage, at least a part, or the whole, of the sectional shape crossing at right angles the laminating direction is arcuate, and the piezoelectric device is accommodated in a cylindrical accommodation space.

It is noteworthy in the tenth aspect of the present invention that the piezoelectric device is built and accommodated in the cylindrical accommodation space, and at least a part, or the whole, of its sectional shape is arcuate. More concretely, when the sectional shape is a polygon, its corners are rounded to arcs, or a part of the circle is cut into a barrel shape, for example. The radius of curvature of the arcuate shape is preferably close to the radius of curvature of the inner peripheral surface of the cylindrical accommodation space.

Since the piezoelectric device has the sectional shape having the arcuate portions described above, the sectional area when the piezoelectric device is accommodated in the cylindrical accommodation space can be made greater than when the sectional is square or hexagonal. Therefore, the force generation of the piezoelectric device can be increased.

Each arcuate portion can be brought into the state where it is very close to the cylindrical accommodation space encircling the piezoelectric device. Therefore, when the arcuate portions are disposed, the distance can be reduced between the piezoelectric device and the cylindrical accommodation space, and heat transfer can be easily achieved from the piezoelectric device to the cylindrical accommodation space when the piezoelectric device generates heat. In consequence, the temperature rise of the piezoelectric device can be suppressed.

The tenth aspect described above provides the piezoelectric device for an injector that can provide a large generation force and has excellent heat radiation performance when it is accommodated in the cylindrical accommodation space.

According to the eleventh aspect of the present invention, a proximity ratio expressed by (B/A)×100 (%), where A is the total length of a circumscribed circle of the piezoelectric device and B is the sum of the length of the circumferential portions having a distance of 0.2 mm or below between the circumscribed circle and the piezoelectric device, is preferably larger than 17%. Consequently, heat radiation performance of the piezoelectric device can be further improved, and durability can be improved, too. More preferably, according to the twelfth aspect, the proximity ratio described above is 32% or more, and heat radiation performance can be further improved.

According to the thirteenth aspect of the present invention, at least two side surface portions having a width of 2.5 mm or more are disposed on the side surface parallel to the laminating direction. In this case, the space defined between the side surface flat portions and the inner surface of the cylindrical accommodation space can be effectively utilized, and side surface electrodes for taking out electrodes can be disposed in the piezoelectric device. Incidentally, disposition of the side electrodes becomes difficult when the width of the side surface flat portion is less than 2.5 mm.

According to the fourteenth aspect of the present invention, an insulating film having a thickness of 0.002 to 0.5 mm is preferably formed on at least the side surface of the piezoelectric device in a direction parallel to the laminating direction. In this way, electric insulation can be secured between the piezoelectric device and the injector accommodating the former, and stable control of the piezoelectric device can be obtained. When the thickness of the insulating film is less than 0.002 mm, sufficient insulation performance cannot be obtained in some cases. When the film thickness exceeds 0.5 mm, on the other hand, heat radiation performance of the piezoelectric device drops.

According to the fifteenth aspect of the present invention, a value R2−R1, where R1 is a maximum outer diameter of the piezoelectric device inclusive of the insulating member and R2 is an inner diameter of the cylindrical accommodation space, is preferably 0.5 mm or below. Consequently, heat transfer from the piezoelectric device to the cylindrical accommodation space can be further improved.

According to the sixteenth aspect of the present invention, the insulating film is preferably made of any of a silicone resin, a polyimide resin, an epoxy resin and a fluorocarbon resin. When any of these resins is used, excellent heat resistance capable of withstanding a temperature of 150° C. or above, for example, can be obtained in addition to a reliable insulating performance.

According to the seventeenth aspect of the present invention, electrode take-out portions electrically connected to the inner electrode layers are preferably disposed on a distal end face and a rear end face of the piezoelectric device in the laminating direction. In this case, the electrode take-out portions need not be disposed on the side surface of the piezoelectric device in a direction crossing at right angles in the laminating direction, and the structure can be further simplified and rendered compact.

According to the eighteenth aspect of the present invention, either one of the distal end face and the rear end face of the piezoelectric device in the laminating direction is preferably equipped with two electrode take-out portions electrically connected to the inner electrode layers. In this case, electric connection with the piezoelectric device can be established on only one of the end faces. Therefore, not only the structure of the piezoelectric device but also the structure of the arrangement to the injector can be simplified.

According to the nineteenth aspect of the present invention, at least one of the electrode take-out portions is preferably connected electrically to at least one of the inner electrode layers through a through-hole formed in the piezoelectric layers. In this case, the arrangement structure of the electrode take-out portions can be simplified.

According to the twentieth aspect of the present invention, at least one of the electrode take-out portions can take the structure in which it is electrically connected to the side surface electrode disposed on the side surface of the piezoelectric device.

BRIEF DESCRIPTION OF THE DRAWINGS

The above objects and features of the present invention will be more apparent from the following description of the preferred embodiments when read in conjunction with the accompanying drawings, wherein:

FIG. 14 is perspective view in a fifth embodiment;

FIG. 15 is a longitudinal sectional view showing the structure of the piezoelectric device in the fifth embodiment;

DESCRIPTION OF THE PREFERRED EMBODIMENTS

Embodiment 1

A piezoelectric device for an injector according to the first embodiment of the present invention will be described with reference to FIGS. 1 to 5.

Figure 5:
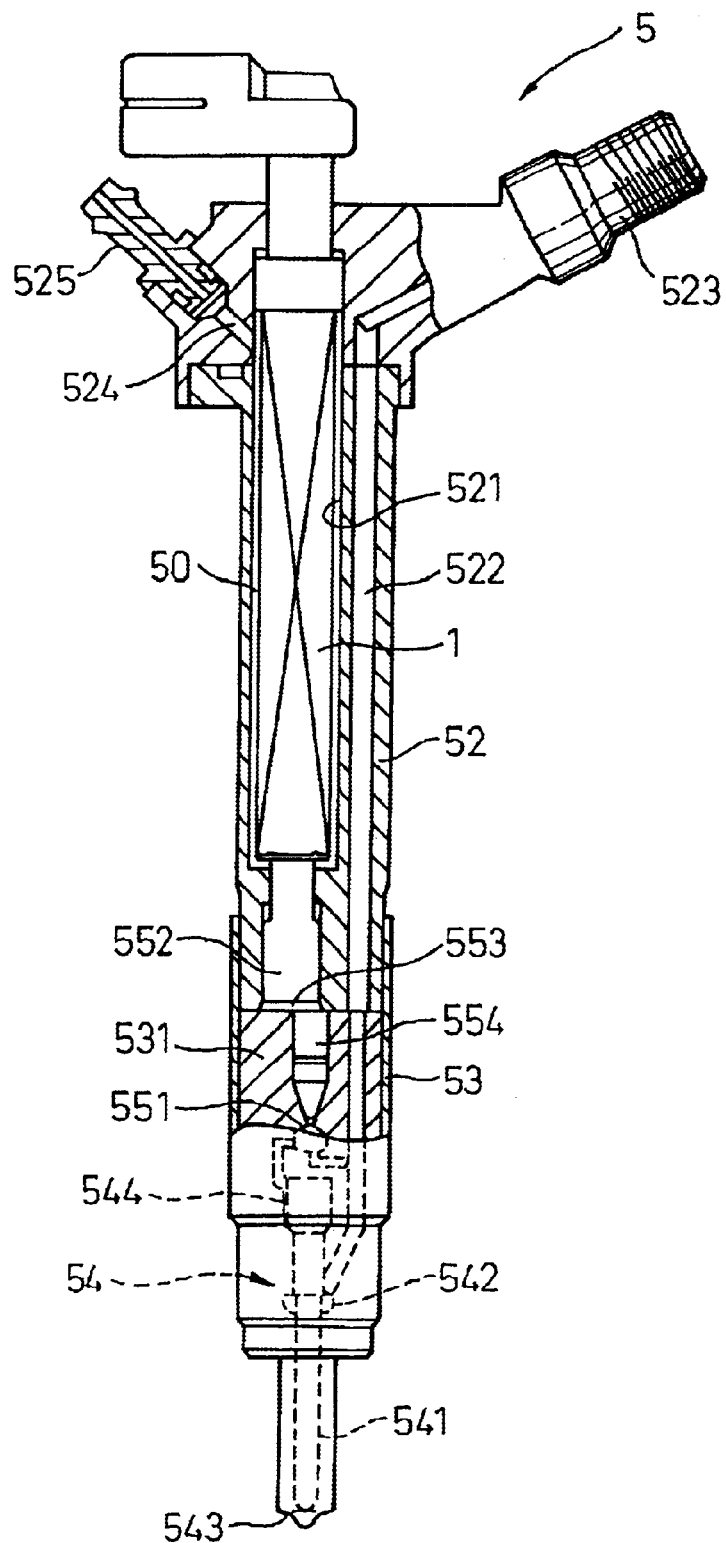
FIG. 5 is an explanatory view showing the structure of an injector in the first embodiment.

The piezoelectric device 1 for an injector according to this embodiment is one that is built into the injector 5 and generates a driving force of the injector 5 as shown in FIG. 5. The piezoelectric device 1 is fabricated by alternately laminating a plurality of piezoelectric layers 11 each generating displacement in proportion to an applied voltage, and internal electrode layers 21, 22 for supplying the applied voltage. When an coercive electric field of the piezoelectric device 1 is Ec, a relation d(0.1 Ec)/d(1.2 Ec)>0.43 is established between an apparent piezoelectric constant d(1.2 Ec), that is calculated from static elongation when an electric field of 1.2 Ec is applied in the same direction as a polarizing direction while a preset load of 500 N is applied to the piezoelectric device 1, and an apparent piezoelectric constant d(0.1 Ec) calculated from static elongation when an electric field of 0.1 Ec is likewise applied in the same direction as the polarizing direction.

Next, this relation will be explained in detail.

Figure 1:
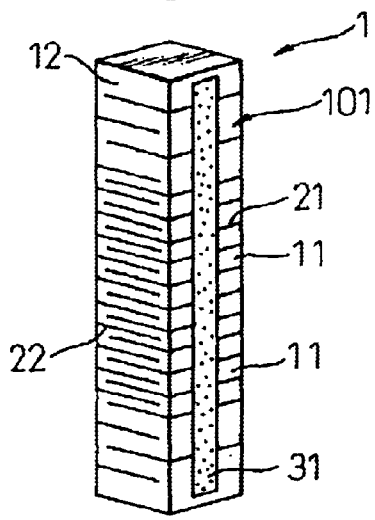
FIG. 1 is a perspective view of a piezoelectric device according to the first embodiment of the present invention.
Figure 2:
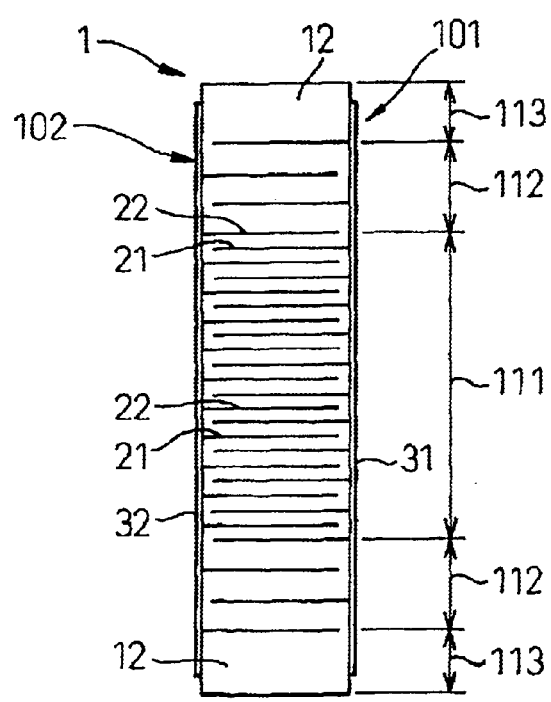
FIG. 2 is a longitudinal sectional view showing the structure of the piezoelectric device in the first embodiment.

As shown in FIGS. 1 and 2, the piezoelectric device 1 is constituted in such a fashion that the internal electrode layers 21 and 22 alternately become positive and negative between the piezoelectric layers 11. As also shown in the drawings, one of the internal electrode layers 21 is so disposed as to be exposed on one of the side surfaces 101 while the other internal electrode layer 22 is so disposed as to be exposed on the other side surface 102. Side electrodes 31 and 32 are formed on the side surfaces 101 and 102 of the piezoelectric device 1 in such a manner as to electrically connect the end portions of the exposed internal electrode layers 21 and 22.

The center portion of the piezoelectric device 1 in the laminating direction is used as a driving portion, and portions sandwiching the driving portion 111 are buffer portions 112. The portions so disposed as to sandwich the buffer portions 112 are dummy portions 113.

The production method of the piezoelectric device 1 and its detailed construction will be explained.

A green sheet method that has widely been employed can be used for producing the piezoelectric device 1 of this embodiment. Powders of principal starting materials of the piezoelectric materials, that is, lead oxide, zirconium oxide, titanium oxide, niobium oxide, strontium carbonate, etc, are weighed by a known method to form a desired composition. In this embodiment, the final composition is a so-called "PZT" (lead zirco-titanate). In view of evaporation of lead, the composition is prepared so that the lead content becomes by 1 to 2% richer than the stoichiometric ratio of the mixture composition. Incidentally, the components of the PZT composition are finely adjusted so that the relation $d(0.1\ Ec)/d(1.2\ Ec)$ described above is at least 0.43, preferably greater than 0.5. These starting materials are dry mixed by a mixer and are then calcined at 800 to 950° C.

Besides the PZT composition whose components are adjusted as described above, it is also possible to use various piezoelectric ceramics and to adjust their components in order to acquire the piezoelectric ceramic having $d(0.1\ Ec)/d(1.2\ Ec)$ of at least 0.43, preferably greater than or equal to 0.5.

Next, pure water and a dispersant are added to calcined powder to prepare slurry, and the slurry is wet pulverized by a pearl mill. After the mixture so pulverized is dried and degreased, a solvent, a binder, a plasticizer, a dispersant, etc, are added, and a ball mill is employed to mix the slurry. Thereafter, the slurry is vacuum defoamed and its viscosity is adjusted while the slurry is being stirred by using a stirrer inside a vacuum apparatus.

Next, the slurry is passed through a doctor blade apparatus to form a green sheet having a predetermined thickness.

After recovery, the green sheet is punched out by a press machine or is cut by a cutting machine into rectangles having a predetermined size. The green sheet is used in common for the driving portion, the buffer portion and the dummy portion.

Figure 3A:
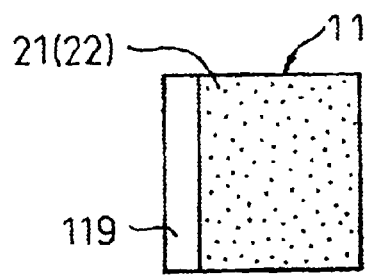
FIG. 3A is a plan view of a green sheet on which an internal electrode layer is printed.
Figure 3B:
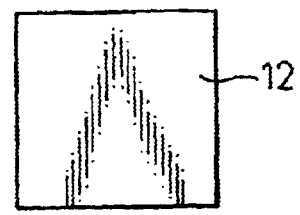
FIG. 3B is a plan view of a green sheet on which the internal electrode layer is not printed.

Next, a pattern is screen-printed to one of the surfaces of the green sheet, after shaping, by using a paste of silver and palladium (hereinafter called the "Ag/Pd paste") having a proportion of silver/palladium=7/3, for example. FIG. 3A shows an example of the green sheet after pattern printing. Incidentally, like reference numerals will be used to identify like constituent members for the sake of explanation.

A pattern 21 (22) that is a little smaller than the surface of the green sheet 11 is formed substantially on the whole surface of the green sheet 11, that is to serve the piezoelectric layer 11, by use of the Ag/Pd paste described above. The pattern 21 (22) serves as the internal electrode layer 21 (22). A non-formation portion 119 of the internal electrode layer 21 (22) is disposed on one of the opposed sides of the surface of the green sheet 11. In other words, the internal electrode layer 21 (22) does not reach one of the end portions of the opposed sides of the green sheet 11 (the portion corresponding to either the side surface 101 or 102 of the piezoelectric device 1), but reaches the other opposed side.

A predetermined number of green sheets 11 having such an internal electrode layer 21 (22) formed thereon are prepared on the basis of the required specification corresponding to the driving portion 111 and the displacement quantity of the buffer portion 112. A predetermined number of green sheets 12 for the buffer portion 112 and for the dummy portion 113, to which the internal electrode layer is not printed, are also prepared.

Figure 4:
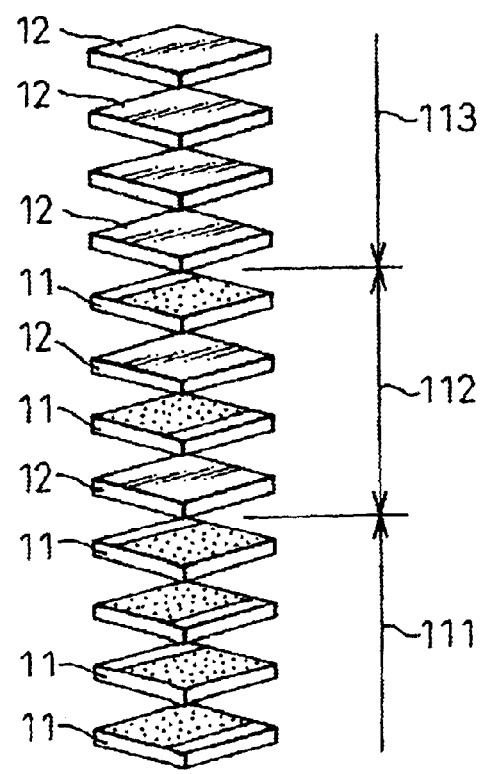
FIG. 4 is an exploded perspective view of the piezoelectric device in the first embodiment.

Next, these green sheets 11 and 12 are put one upon another. FIG. 4 shows a lamination state of the green sheets 11 and 12 and is substantially an exploded view of the piezoelectric device 1.

When the green sheets 11 having the internal electrode layer 21 (22) are laminated, they are laminated in such a fashion that the electrode non-formation portions 119 are alternately positioned to the right and the left in the drawing. In consequence, each internal electrode layer 21 reaching the side surface 101 of the green sheet 11 on the right side in the drawing and exposed serves as the internal electrode having one of polarity, and each internal electrode layer 22 reaching the side surface 102 on the left side in the drawing and exposed serves as the internal electrode of the other polarity.

In the driving portion 111 at the center, only the green sheets 11 having the internal electrode layer 21 (22) are laminated as shown in FIG. 4. In the buffer portion 112, on the other hand, the green sheets 12 not having the internal electrode layer are sandwiched between pairs of the green sheets 11. Further, in the dummy portions 113, only the green sheets 12 not having the internal electrode layer are laminated.

There is thus obtained a laminate body having the structure shown in FIG. 2.

Next, after heat pressing is performed by using a hot water rubber press, or the like, degreasing is conducted at 400 to 700° C. inside an electric furnace. The laminate body is then baked at 900 to 1,200° C.

Next, the Ag/Pd paste or the Ag paste is applied and baked to the side surface of the laminate body, forming the external electrodes 31 and 32.

The external electrode 31 is formed at the position at which the internal electrode layer 21 having one of polarity is exposed to establish electric connection to each internal electrode layer 21. The other external electrode 32 is formed at the position at which the internal electrode layer 22 having the other polarity is exposed to establish electric connection to each internal electrode layer 22.

The assembly so obtained is thereafter immersed in insulating oil, and a DC voltage is applied across the internal electrode layers 21 and 22 from the external electrodes 31 and 32 to thereby polarize the piezoelectric layer 11 and to obtain the piezoelectric device 1.

In the dummy portion 113, the same green sheet (piezoelectric layer) 12 as the piezoelectric layer 11 used for the driving portion 111 is used as described above to prevent the increase of the number of kinds of production materials and to reduce the production cost. However, the piezoelectric layer 12 of the dummy portion 113 may be made of other materials such as insulating and magnetic materials.

The matter of importance in the piezoelectric device 1 of this embodiment is that when an coercive electric field of the piezoelectric device 1 is Ec, the relation $d(0.1\ Ec)/d(1.2\ Ec) \geq 0.5$ is established between an apparent piezoelectric constant $d(1.2\ Ec)$, that is calculated from static elongation when an electric field of 1.2 Ec is applied in the same direction as a polarizing direction while a preset load of 500 N is applied to the piezoelectric device 1, and an apparent piezoelectric constant $d(0.1\ Ec)$ calculated from static elongation when an electric field of 0.1 Ec is likewise applied in the same direction as the polarizing direction.

Here, the coercive electric field Ec, which causes the changing of polarizing direction, will be explained first.

Figure 6:
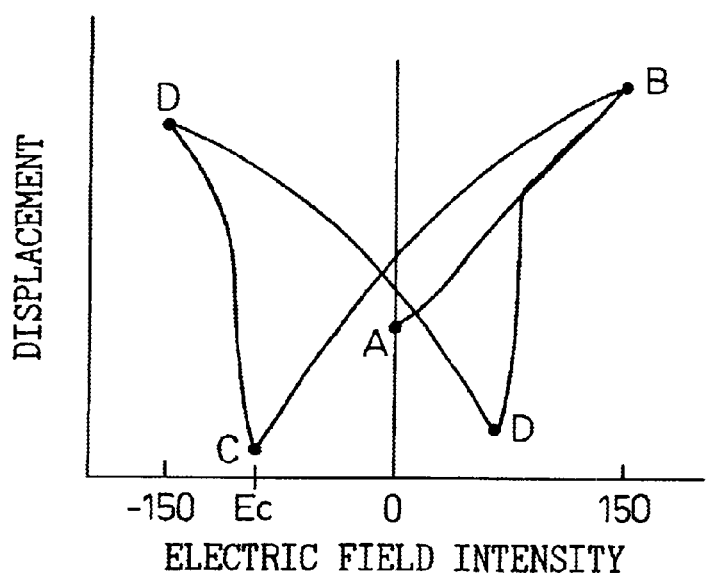
FIG. 6 is an explanatory view showing an coercive electric field Ec in the first embodiment.

FIG. 6 is an explanatory view of the coercive electric field Ec. In the drawing, the electric field intensity (voltage) to be applied to the piezoelectric device is plotted to the abscissa and the displacement, to the ordinate. Incidentally, the field intensity is positive (+) in the same direction as the polarizing direction and negative (−), in the opposite direction to the polarizing direction.

First, the electric field is applied to the piezoelectric device 1 in the same direction as the polarizing direction from the point A and its value is gradually increased. Displacement of the piezoelectric body 1 increases with the increase of the field intensity.

Next, after the field intensity reaches a point B of 150 V, it is gradually lowered. Displacement decreases this time with the decrease of the field intensity. When the field intensity reaches 0, too, the field intensity is continuously lowered in the direction opposite to the polarizing direction. Displacement further decreases with the decrease of the field intensity. In this embodiment, displacement abruptly changes to the increase when the field intensity reaches −90 V (point C). The absolute value (90 V) of the field intensity at this point is the coercive electric field Ec in the present invention.

When the field intensity thereafter reaches a point D of −150V, the field intensity is again increased, and displacement decreases this time with the increase of the field intensity. The field intensity then reaches 0. As the field intensity is further increased in the polarizing direction, displacement abruptly starts increasing at the point at which the field intensity reaches. The field intensity at this point D is called the "coercive electric field", too, but is not the EC mentioned in the present invention. In other words, the present invention limits the coercive electric field Ec to only the coercive electric field when the voltage is applied in the direction opposite to the polarizing direction.

When the electric field is thereafter increased, displacement finally reaches a state substantially equal to that of the point B and repeats thereafter a similar behavior.

The piezoelectric constants d(0.1 Ec) and d(1.2 Ec) are determined on the basis of Ec calculated as described above. The piezoelectric constant can be calculated from a change ratio of displacement when the electric field intensity that is gradually applied is increased, that is, from the inclination of a graph when the graph representing the relation between the field intensity and displacement is prepared. In this embodiment, therefore, the relation between displacement and voltage is determined when a field intensity of 150 V is applied in the same direction as the polarizing direction.

Figure 7:
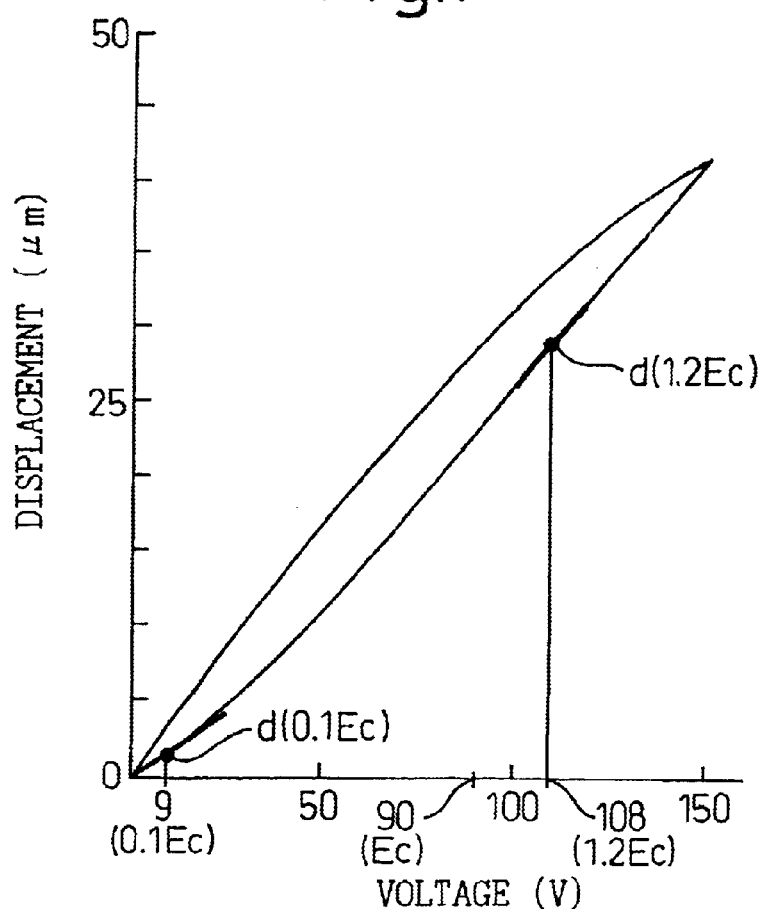
FIG. 7 is an explanatory view showing piezoelectric constants d(0.1 Ec) and d(1.2 Ec) in the first embodiment.

In FIG. 7, the field intensity (voltage) (V) is plotted on the abscissa and displacement ($\mu$m), on the ordinate. While a preset load of 500 N is applied from above and below to the piezoelectric device 1, the voltage is applied in the same direction as the polarizing direction and its value is gradually increased. The trajectory of displacement is plotted in FIG. 7. Incidentally, a curve is determined by lowering the field intensity from 150 V to 0 V, too, in FIG. 7 but only the case where the field intensity is increased is important in this embodiment.

The piezoelectric constants described above can be determined by the change ratios when the value is 0.1 Ec (9V) and is 1.2 Ec (108V) while the field intensity is increased, respectively. In this embodiment, the piezoelectric constant d(0.1 Ec) is 0.37 and the piezoelectric constant d(1.2 Ec) is 0.68. Therefore, their ratio is 0.37/0.68, that is, 0.54. This value sufficiently exceeds the value 0.43.

Next, an example of an injector that can use the piezoelectric device 1 having the structure described above as the driving source will be briefly explained.

The injector 5 is applied to a common rail injection system of a Diesel engine as shown in FIG. 5.

The injector 5 shown in FIG. 5 includes an upper housing 52 accommodating the piezoelectric device 1 as the driving portion and a lower housing 53 fixed to the lower end of the upper housing 52 and forming therein an injection nozzle portion 54.

The upper housing 52 is substantially circularly cylindrical, and the piezoelectric device 1 is fitted into, and fixed to, a longitudinal hole 521 that is eccentric to a center axis.

A high-pressure fuel passage 522 is disposed in parallel with, and on the side of, the longitudinal hole 521, and its upper end portion passes through a fuel introduction pipe 523 protruding upward from the upper housing 52, and communicates with an external common rail (not shown).

A fuel lead-out pipe 525 communicating with a drain passage 524 protrudes upward from the upper housing 52, and the fuel flowing out from the fuel lead-out pipe 525 is returned to a fuel tank (not shown).

The drain passage 524 communicates with a later-appearing three-way valve 551 through a passage that passes through a gap 50 between the longitudinal hole 521 and the driving portion (piezoelectric device) 1 and extends down from this gap 50 inside the upper and lower housings 52 and 53.

The injection nozzle portion 54 includes a nozzle needle 541 that slides up and down inside a piston body 531 and an injection hole 543 that is opened and closed by the nozzle needle 541 and injects the high-pressure fuel supplied from a fuel reservoir 542 into each cylinder of an engine. The fuel reservoir 542 is formed around an intermediate portion of the nozzle needle 541, and the lower end portion of the high-pressure fuel passage 522 opens to this fuel reservoir 542. The nozzle needle 541 receives the fuel pressure from the fuel reservoir 542 in the valve opening direction and the fuel pressure from a backpressure chamber 544 so disposed as to face the upper end face in the valve closing direction. When the pressure of the backpressure chamber 544 drops, the nozzle needle 541 lifts, so that the injection hole 543 is opened and the fuel is injected.

The three-way valve 551 increases and decreases the pressure of the backpressure chamber 544. The three-way valve 551 is constituted in such a fashion as to selectively communicate with the backpressure 544 and the high-pressure fuel passage 522 or the drain passage 524. Here, the backpressure chamber has a ball-like valve disc that opens and closes a port communicating with the high-pressure fuel passage 522 or the drain passage 524. The driving portion 1 described above drives this valve disc through a large diameter piston 552, an oil pressure chamber 553 and a small diameter piston 554 that are disposed below the driving portion 1, respectively.

Next, the function and effect of this embodiment will be explained.

In the piezoelectric device 1 of this embodiment, the ratio d(0.1 Ec)/d(1.2 Ec) of the piezoelectric constants is at least 0.43, preferably greater than 0.5. Therefore, the piezoelectric device 1 is excellent in heat resistance and exhibits extremely high durability.

Since the ratio of the piezoelectric constants d(0.1 Ec)/d(1.2 Ec) is greater than 0.43 as described above, an efficient piezoelectric displacement component occupies more than the half of the displacement components of the piezoelectric device 1. Therefore, an energy loss is small when displacement repeatedly occurs, and self-exothermy is also small. Heat resistance is higher and durability can be much more improved than when the ratio of the piezoelectric constants d(0.1 Ec)/d(1.2 Ec) is smaller than 0.43.

Therefore, the piezoelectric device 1 of this embodiment exhibits excellent durability and can be used for a long time when applied to the injector 5.

Embodiment 2

Four kinds of piezoelectric devices (samples 1 to 4) each having the same structure as that of the piezoelectric device 1 of the first embodiment but having a different composition of the piezoelectric layer are prepared, and the ratios of the piezoelectric constants d(0.1 Ec)/d(1.2 Ec) are determined respectively. The temperature rise due to self-exothermy of each piezoelectric device is measured. The durability of each piezoelectric device is evaluated on the basis of the measurement result. All the piezoelectric devices prepared use PZT as the piezoelectric layer, but the component compositions are changed so that the ratios of the piezoelectric constants become different.

Table 1 show the measurement values of the ratios of the piezoelectric constants d(0.1 Ec)/d(1.2 Ec) of the samples. The measurement method in this case is the same as that of the first embodiment. To measure the temperature due to self-exothermy, the temperature of the side surface at the center in the laminating direction is measured while the piezoelectric device is driven at an applied voltage of 0 to 1.5 V/mm and a frequency of 200 Hz.

The result is tabulated in Table 1. It can be appreciated from Table 1 that the temperature rise due to self-exothermy can be limited to below 100° C. when the ratio d(0.1 Ec)/d(1.2 Ec) is greater than 0.43. In contrast, when the ratio is less than 0.43, the temperature rise exceeds 100° C. in some cases. It can be anticipated from these temperature rises that when each piezoelectric device is operated 1×10$^9$ times, for example, for durability test, the devices having a ratio of greater than 0.43 exhibit durability clearing the test (◯) and those having a ratio of less than 0.43 do not exhibit improvement in durability because they cannot pass the test (X).

TABLE 1

| sample | piezoelectric constant d(0.1 Ec/d (1.2Ec) | temperature rise (C.) | durability |
| --- | --- | --- | --- |
| 1 | 0.40 | 118 | X |
| 2 | 0.43 | 110 | X |
| 3 | 0.50 | 98 | ◯ |
| 4 | 0.65 | 80 | ◯ |

Embodiment 3

In this embodiment, the change ratio of displacement of each of the four samples (samples 1 to 4) used in the second embodiment with respect to the frequency of the applied voltage is measured.

Figure 8:
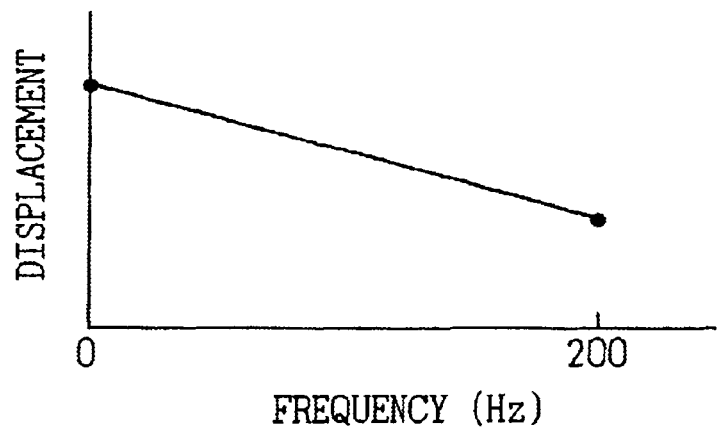
FIG. 8 is an explanatory view showing a change ratio of displacement relative to a frequency in a third embodiment.

More concretely, while a preset load of 500 N is applied to each sample, an AC voltage is applied so that the electric field intensity of 0 to 1.5 kV/mm can be created by a sine wave. While the frequency of the applied voltage is gradually changed from 1 Hz to 200 Hz, displacement of each piezoelectric device is determined as shown in FIG. 8. This graph shows an example of the change ratio of displacement. The frequency of the applied voltage is plotted on the abscissa and displacement of each piezoelectric device, on the ordinate.

Table 2 shows the change ratio of displacement of each sample with the measurement result of the temperature rise due to self-exothermy of each piezoelectric device.

As a result, it has been found that when the displacement change ratio is smaller than 9%, preferably 7.0%, the temperature rise can be limited to 100° C. or below. Therefore, durability is excellent (◯), too. When the displacement change ratio exceeds 9%, the temperature rise is high and an improvement in durability cannot be expected (X).

TABLE 2

| sample | displacement change ratio (%) | temperature rise (C.) | durability |
| --- | --- | --- | --- |
| 1 | 12 | 118 | X |
| 2 | 9 | 110 | X |
| 3 | 7 | 98 | ◯ |
| 4 | 3 | 80 | ◯ |

Embodiment 4

In this embodiment, a dielectric loss is determined from a P-E hysteresis (charge—voltage hysteresis) of each of the four samples (samples 1 to 4) used in the second embodiment, and the relation between this value and the temperature rise due to self-exothermy is examined.

First, the P-E hysteresis of each sample is determined in the following way.

Figure 9:
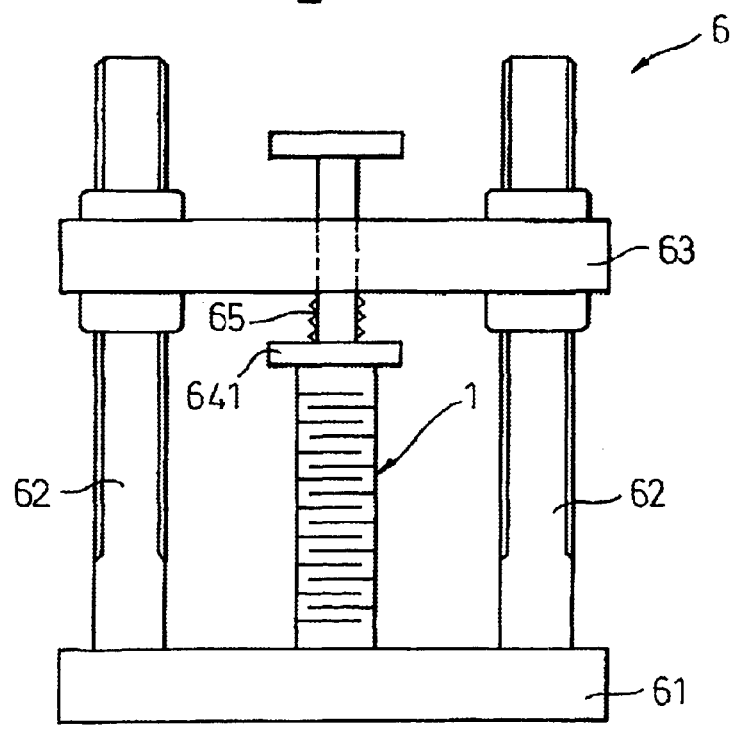
FIG. 9 is an explanatory view showing a measuring jig in the third embodiment.

A measuring jig 6 is prepared as shown in FIG. 9. The measuring jig 6 has two guide poles 62 implanted onto a stool 61. A bridge 63 is mounted to the guide poles 62, and a pressing portion 64 having a pressing plate 641 is disposed at the center of the bridge 63. The piezoelectric device 1 is sandwiched between the pressing plate 641 and the stool 61. The pressing plate 641 applies a preset load of 10 MPa in cooperation with a flat-head spring 65 interposed between the pressing plate 641 and the bridge 63.

Figure 10:
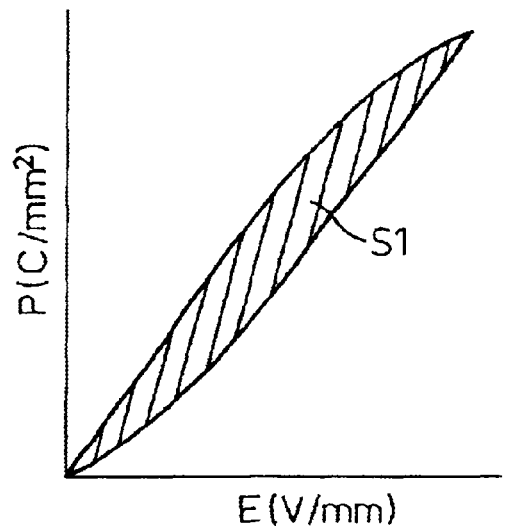
FIG. 10 is an explanatory view showing a P-E hysteresis and an area S1 in the third embodiment.

Under this state, a sine wave voltage having a field intensity of 0 to 1.5 kv/mm and a frequency of 100 Hz is applied to each piezoelectric device 1 to determine hystereis as shown in FIG. 10. In this graph, the electric field E (V/mm) is plotted on the abscissa and an integration value P (charge density: C/mm$^2$) is plotted on the ordinate. The voltage is gradually increased in the same direction as the polarizing direction and is thereafter decreased gradually so as to plot the trajectory of P.

Figure 11:
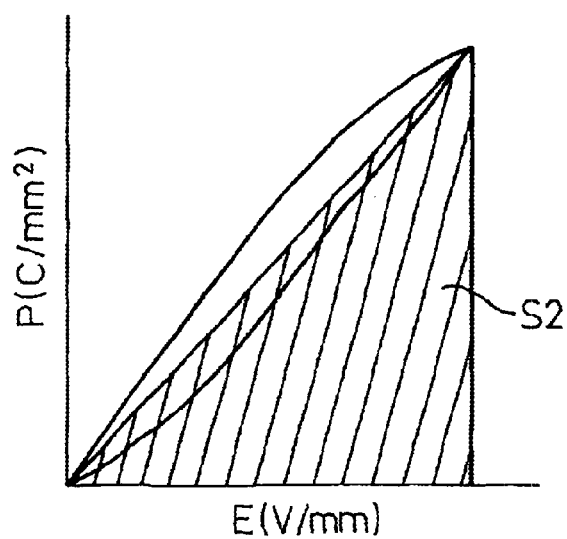
FIG. 11 is an explanatory view showing a P-E hysteresis and an area S2 in the third embodiment.
Figure 12:
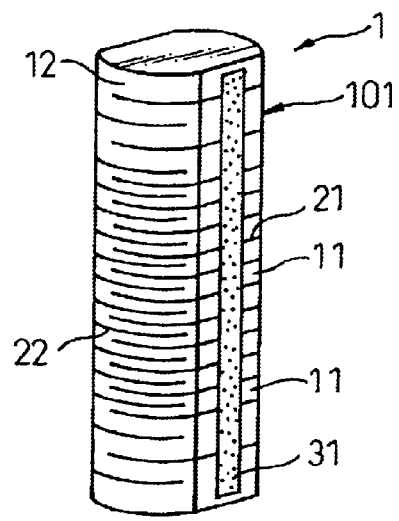
FIG. 12 is an explanatory view showing a barrel-shaped piezoelectric device in a fourth embodiment.

The area of a portion encompassed by the resulting hysteresis curves is called "S1" as shown in FIG. 10. Next, as shown in FIG. 11, an area S2 of a triangle encompassed by a line that connects the origin O to the highest point Q, a line that is drawn perpendicularly from the point Q to the abscissa, and the abscissa. The dielectric loss can be calculated from these values.

In other words, the dielectric loss (%) can be calculated from $S1/S2/(2\pi) \times 100$.

When the resulting dielectric loss is compared with a dielectric loss measured at 1 V by an impedance analyzer used ordinarily, the dielectric loss when the piezoelectric device is actually used can be estimated.

Next, Table 3 shows the dielectric loss of each sample 1 to 4 obtained in this way together with the temperature rise due to self-exothermy obtained in the same way as in the first embodiment.

It can be appreciated from Table 3 that when the dielectric loss obtained on the basis of the P-E hysteresis described above is smaller than 8%, preferably smaller than 7%, the temperature rise due to self-exothermy can be limited to 100° C. or below. Therefore, durability is believed high (◯). When the displacement change ratio exceeds 8.0%, the temperature rise is high, and an improvement of durability cannot be expected (X).

TABLE 3

| sample | dielectric loss (%) | temperature rise (° C.) | durability |
|---|---|---|---|
| 1 | 10 | 118 | X |
| 2 | 8 | 110 | X |
| 3 | 7 | 98 | ○ |
| 4 | 2 | 80 | ○ |

Incidentally, the present invention can acquire its function and effect irrespective of the shape of the piezoelectric device. For example, a similar function and effect can be obtained when the piezoelectric device 1 has a barrel-shaped section.

Figure 13:
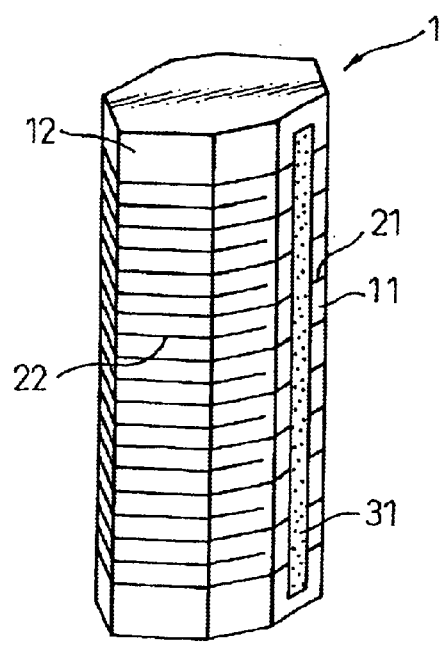
FIG. 13 is an explanatory view showing a piezoelectric device having an octagonal section in the fourth embodiment.

The similar function can be likewise obtained when the piezoelectric device 1 has an octagonal section as shown in FIG. 13.

Reference numerals used hereinafter for explaining the following embodiments are not applied to the foregoing embodiments but are solely used for the following embodiments. Hereinafter, still other embodiments of the present invention will be explained.

Embodiment 5

A piezoelectric device for an injector according to the fifth embodiment of the present invention will be explained with reference to FIGS. 14 to 19.

Figure 19:
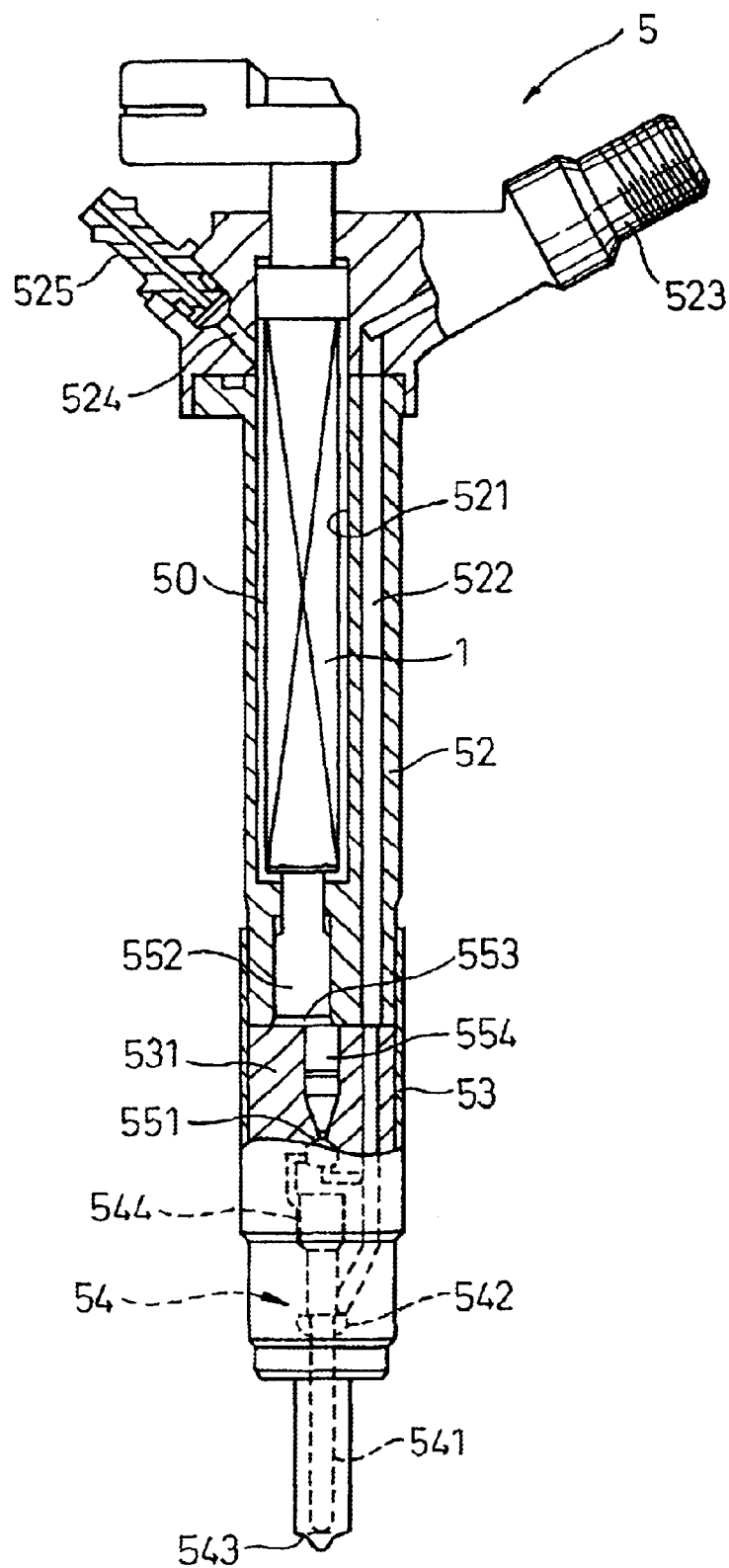
FIG. 19 is an explanatory view showing the structure of an injector in the first embodiment.

The piezoelectric device for an injector according to this embodiment is the piezoelectric device that is built in the injector 5 and generates the driving force of the injector 5 as shown in FIG. 19. As shown in FIG. 14, the piezoelectric device 1 includes a plurality of piezoelectric layers 11 that expand and contract in accordance with an applied voltage, and internal electrode layers 21 and 22 for supplying the applied voltage, whereby the piezoelectric layers 11 and the internal electrode layers 21 and 22 are alternately laminated. The sectional shape crossing at right angles the laminating direction is partly arcuate. The piezoelectric device 1 is accommodated in a cylindrical case 4 that constitutes a circular cylindrical accommodation space.

The piezoelectric device 1 is fabricated in such a fashion that the internal electrode layers 21 and 22 alternately become positive and negative between adjacent pairs of piezoelectric layers as shown in FIGS. 14 and 15. One 21 of the internal electrode layers is exposed on one 101 of the side surfaces and the other internal electrode layer 22 is exposed on the other side surface 102 as shown in these drawings. Side surface electrodes 31 and 32 are formed on the side surfaces 101 and 102 of the piezoelectric device 1 so as to electrically connect the end portions of the internal electrode layers 21 and 22 so exposed.

In the piezoelectric device 1, the center portion in the laminating direction is a driving portion 111, and portions so arranged as to sandwich the driving portion 111 are buffer portions 112. Further, portions so arranged as to sandwich the buffer portions are dummy portions 113.

In the piezoelectric device 1 in this embodiment, two line portions connect arcuate portions into a barrel-shaped section as shown in FIGS. 14 and 15.

A production method of this piezoelectric device 1 and its detailed structure will be explained.

A green sheet method that has been widely employed can be used for producing the piezoelectric device 1 of this embodiment. Powders of principal starting materials of the piezoelectric material, that is, lead oxide, zirconium oxide, titanium oxide, niobium oxide, strontium carbonate, etc, are weighed by a known method to form a desired composition. In view of evaporation of lead, the composition is prepared so that the lead content becomes by 1 to 2% richer than the stoichiometric ratio of the mixture composition. These starting materials are dry mixed by a mixer and are then calcined at 800 to 950° C.

Next, pure water and a dispersant are added to calcined powder to prepare slurry, and the slurry is wet pulverized by a pearl mill. After the pulverizate is dried and degreased, a solvent, a binder, a plasticizer, a dispersant, etc, are added. A ball mill is employed to mix the slurry. Thereafter, the slurry is vacuum defoamed and its viscosity is adjusted while the slurry is being stirred by using a stirrer inside a vacuum apparatus.

Next, the slurry is passed through a doctor blade apparatus to form a green sheet having a predetermined thickness.

After recovery, the green sheet is punched out by a press machine or is cut by a cutting machine into rectangles having a predetermined size. The green sheet is used in common for the driving portion, the buffer portion and the dummy portion.

Figure 16A:
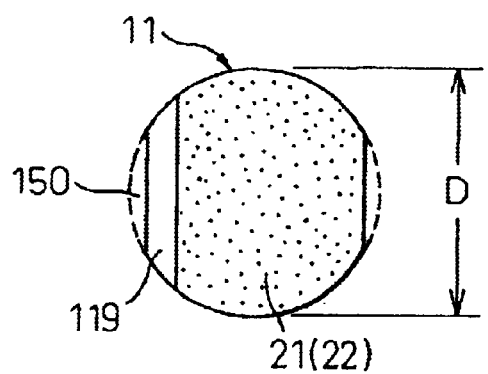
FIG. 16A is a plan view showing a green sheet on which an internal electrode layer is printed.
Figure 16B:
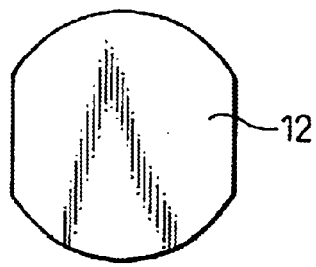
FIG. 16B is a plan view showing a green sheet on which the internal electrode layer is not printed.

Next, a pattern is screen-printed to one of the surfaces of the green sheet after shaping by using a paste of silver and palladium (hereinafter called the "Ag/Pd paste") having a proportion of silver/palladium=7/3, for example. FIG. 16A shows an example of the green sheet after pattern printing. Incidentally, like reference numerals will be used to identify like constituent members for the sake of explanation.

A barrel-shaped pattern 21 (22) that is a little smaller than the surface of the green sheet 11 is formed on the substantial whole surface of the green sheet 11 that is to serve the piezoelectric layer by use of the Ag/Pd paste described above to form the internal electrode layers 21 (22). A non-formation portion 119 of the internal electrode layer 21 (22) is disposed on one of the opposed sides of the surface of the green sheet 11. In other words, the internal electrode layer 21 (22) does not reach one of the end portions of the opposed sides of the green sheet 11 (the portion corresponding to either the side surface 101 or 102 of the piezoelectric device 1), but reaches the other opposed side.

A predetermined number of green sheets 11 having such an internal electrode layer 21 (22) formed thereon are prepared on the basis of the required specification corresponding to the driving portion 111 and the displacement quantity of the buffer portion 112. A predetermined number of green sheets 12 for the buffer portion 112 and for the dummy portion 113, to which the internal electrode layer is not printed, are also prepared.

Figure 17:
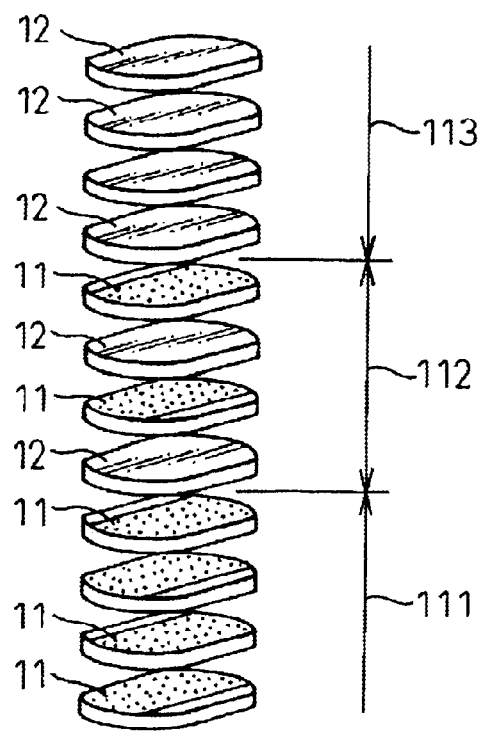
FIG. 17 is an exploded perspective view of a piezoelectric device in the first embodiment.
Figure 18:
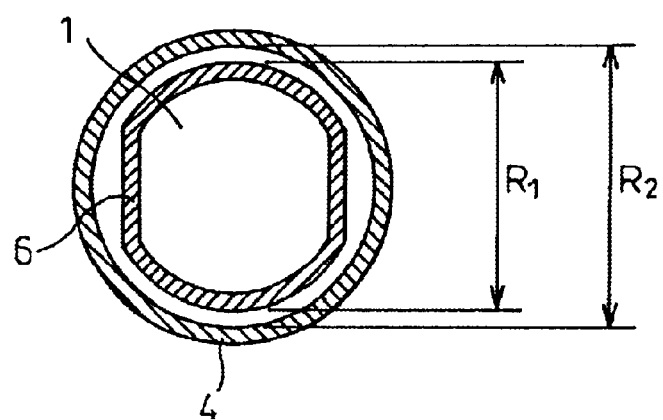
FIG. 18 is an explanatory view showing a dimensional relation among the piezoelectric device, an insulating film and a cylindrical case.

Next, these green sheets 11 and 12 are put one upon another. FIG. 17 shows a lamination state of the green sheets 11 and 12 and is substantially an exploded view of the piezoelectric device 1.

When the green sheets 11 having the internal electrode layer 21 (22) are laminated, they are laminated in such a fashion that the electrode non-formation portions 119 are alternately positioned to the right and the left in the drawing. In consequence, each internal electrode layer 21 reaching the side surface 101 of the green sheet 11 on the right side in the drawing and exposed serves as the internal electrode having one of polarity, and each internal electrode layer 22 reaching the side surface 102 on the left side in the drawing and exposed serves as the internal electrode of the other polarity.

In the driving portion 111 at the center, only the green sheets 11 having the internal electrode layer 21 (22) are laminated as shown in FIG. 17. In the buffer portion 112, on the other hand, the green sheets 12 not having the internal electrode layer are sandwiched between pairs of the green sheets 11. Further, in the dummy portions 113, only the green sheets 12 not having the internal electrode layer are laminated.

There is thus obtained a laminate body having the structure shown in FIG. 15.

Next, after heat pressing is performed by using a hot water rubber press, or the like, degreasing is conducted at 400 to 700° C. inside an electric furnace. The laminate body is then baked at 900 to 1,200° C.

Next, the Ag/Pd paste or the Ag paste is applied and baked to the side surface of the laminate body, forming the external electrodes 31 and 32.

The external electrode 31 is formed at the position at which the internal electrode layer 21 having one of polarity is exposed, to establish electric connection for each internal electrode layer 21. The other external electrode 32 is formed at the position at which the internal electrode layer 22 having the other polarity is exposed, to establish electric connection for each internal electrode layer 22.

The assembly so obtained is thereafter immersed in insulating oil, and a DC voltage is applied across the internal electrode layers 21 and 22 from the external electrodes 31 and 32 to thereby polarize the piezoelectric layer 11 and to obtain the piezoelectric device 1.

In the dummy portion 113, the same green sheet (piezoelectric layer) 12 as the piezoelectric layer 11 used for the driving portion 111 is used as described above to prevent the increase of the number of kinds of production materials and to reduce the production cost. However, the piezoelectric layer 12 of the dummy portion 113 may be made of other materials such as insulating and magnetic materials.

The matter of importance in the piezoelectric device 1 of this embodiment is that two arcuate portions are disposed as described above so as to increase the proximity with the inner surface of the cylindrical case.

In this embodiment, the side surfaces 101 and 102 parallel to the laminating direction are side surface flat portions having a width of at least 2.5 mm. The side surface electrodes 31 and 32 are provided to the side surface flat portions 101 and 102 as described above.

Lead wires (not shown) as electrode take-out portions are bonded to the external electrodes 31 and 32 of the side surface portions 101 and 102 of the piezoelectric device 1, respectively. An insulating film 6 having a thickness of 0.002 to 0.5 mm is formed on the entire side surfaces 101 and 102 of the piezoelectric device 1 crossing at right angles the laminating direction (see FIG. 18). This embodiment uses silicon resin as the insulating film 6.

While the insulating film is disposed, the piezoelectric device 1 is accommodated into the cylindrical case 4. In this instance, the maximum outer diameter R1 of the piezoelectric device 1 inclusive of the insulating member 6 and the inner diameter R2 of the cylindrical case are set so that an R2–R1 value is not greater than 0.5 mm.

Next, an example of an injector that can use the piezoelectric device 1 having the structure described above as the driving source will be briefly explained.

The injector 5 is applied to a common rail injection system of a Diesel engine as shown in FIG. 19.

The injector 5 shown in FIG. 19 includes an upper housing 52 accommodating the piezoelectric device 1 as the driving portion and a lower housing 53 fixed to the lower end of the upper housing 52 and forming therein an injection nozzle portion 54.

The upper housing 52 is substantially circularly cylindrical, and the piezoelectric device 1 is hermetically fitted into, and fixed to, a longitudinal hole 521 that is eccentric to a center axis.

A high-pressure fuel passage 522 is disposed in parallel with, and on the side of, the longitudinal hole 521, and its upper end portion passes through a fuel introduction pipe 523 protruding upward from the upper housing 52, and communicates with an external common rail (not shown).

A fuel lead-out pipe 525 communicating with a drain passage 524 protrudes upward from the upper housing 52, and the fuel flowing out from the fuel lead-out pipe 525 is returned to a fuel tank (not shown).

The drain passage 524 communicates with a later-appearing three-way valve 551 through a passage that passes through a gap 50 between the longitudinal hole 521 and the driving portion (piezoelectric device) 1 and extends down from this gap 50 inside the upper and lower housings 52 and 53.

The injection nozzle portion 54 includes a nozzle needle 541 that slides up and down inside a piston body 531 and an injection hole 543 that is opened and closed by the nozzle needle 541 and injects the high-pressure fuel supplied from a fuel reservoir 542 into each cylinder of an engine. The fuel reservoir 542 is formed around an intermediate portion of the nozzle needle 541, and the lower end portion of the high-pressure fuel passage 522 opens to this fuel reservoir 542. The nozzle needle 541 receives the fuel pressure from the fuel reservoir 542 in the valve opening direction and the fuel pressure from a backpressure chamber 544 so disposed as to face the upper end face in the valve closing direction. When the pressure of the backpressure chamber 544 drops, the nozzle needle 541 lifts, so that the injection hole 543 is opened and the fuel is injected.

The three-way valve 551 increases and decreases the pressure of the backpressure chamber 544. The three-way valve 551 is constituted in such a fashion as to selectively communicate with the backpressure 544 and the high-pressure fuel passage 522 or the drain passage 524. Here, the backpressure chamber 544 has a ball-like valve disc that opens and closes a port communicating with the high-pressure fuel passage 522 or the drain passage 524. The driving portion 1 described above drives this valve disc through a large diameter piston 552, an oil pressure chamber 553 and a small diameter piston 554 that are disposed below the driving portion 1, respectively.

This embodiment uses the piezoelectric device 1 as the driving source in the injector 5 described above. The piezoelectric device 1 is constituted in such a fashion that it is built in the circular cylindrical case 4, and at least a part of its sectional shape is arcuate as described above. More concretely, the piezoelectric device 1 in this embodiment has a barrel-shaped sectional shape.

Therefore, the piezoelectric device 1 of this embodiment can increase the sectional area when accommodated in the cylindrical case much more than when the sectional shape is rectangular or hexagonal, and the accommodation space can be effectively utilized. In this embodiment, the side surfaces 101 and 102 for disposing the side electrodes are the side surface flat portions having a width of at least 2.5 mm. Therefore, the side surface electrodes can be disposed without swelling from the circumscribing circle of the piezoelectric device 1.

As a result, the piezoelectric device 1 can occupy a sufficiently large sectional area inside the cylindrical case 4. In consequence, the generation force of the piezoelectric device 1 can be increased.

The arcuate portions can be brought into an extremely proximate state to the cylindrical case 4 encircling the piezoelectric device 1. When the arcuate portions are disposed, therefore, proximity between the piezoelectric device 1 and the cylindrical case 4 can be increased, and heat transfer can be efficiently achieved from the piezoelectric device to the cylindrical case. When the piezoelectric device 1 itself generates heat, this heat can be easily radiated from the cylindrical case. Consequently, the temperature rise of the piezoelectric device can be suppressed.

Therefore, the piezoelectric device 1 according to this first embodiment can exhibit a large generation force and has high heat radiation performance when it is accommodated in the cylindrical case 4.

In the piezoelectric device 1 of this embodiment, an insulating film 6 having a thickness of 0.002 to 0.5 mm is formed on the entire surface crossing at right angles the laminating direction. Therefore, electric insulation of the piezoelectric device 1 can be reliably secured inside the cylindrical case 4.

When the piezoelectric device 1 is accommodated in the cylindrical case 4, the difference of the maximum outer diameter R1 of the piezoelectric device 1 inclusive of the insulating member 6 and the inner diameter R2 of the cylindrical case, that is, R2−R1, is not greater than 0.5 mm, and they are very proximate to each other. Therefore, heat transfer between them becomes excellent, and a sufficient margin can be secured against the increase of the thermal load resulting from miniaturization of the piezoelectric device 1.

Embodiment 6

This embodiment represents an example of a piezoelectric device whose sectional shape is octagonal.

Figure 20:
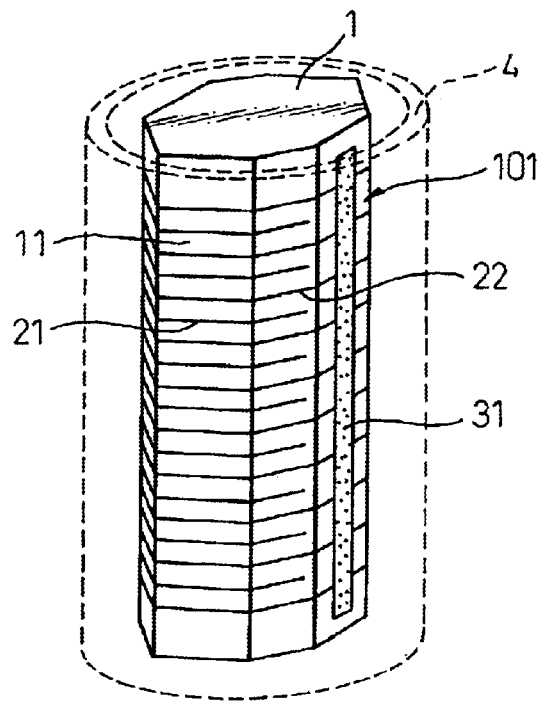
FIG. 20 is a perspective view of a piezoelectric device in the second embodiment.

As shown in FIG. 20, the piezoelectric device 1 of this embodiment 1 is fabricated by alternately laminating a plurality of piezoelectric layers 11 expanding and contracting in accordance with an applied voltage and a plurality of internal electrode layers 2 for supplying the applied voltage, whereby the sectional shape crossing at right angles the laminating direction is octagonal. The production method of this piezoelectric device 1 is the same as that of the first embodiment with the exception that only the sectional shape is different.

Figure 21:
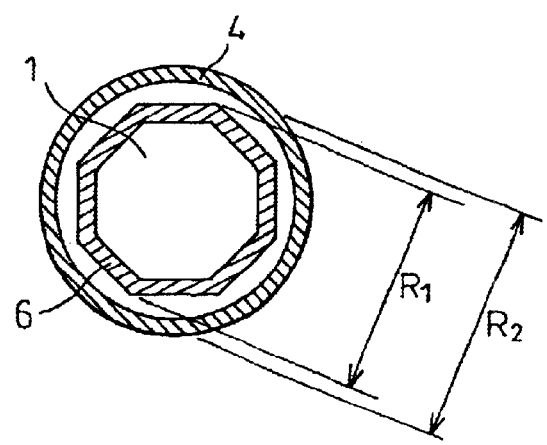
FIG. 21 is an explanatory view showing a dimensional relation among the piezoelectric device, an insulating film and a cylindrical case.
Figure 22A:
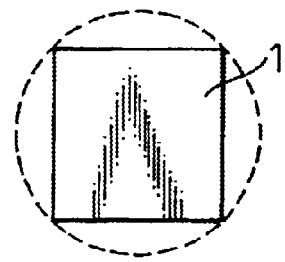
FIGS. 22A to 22F are explanatory views showing sectional shapes of respective samples in the third embodiment.
Figure 22B:
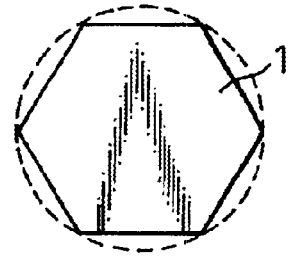
Figure 22C:
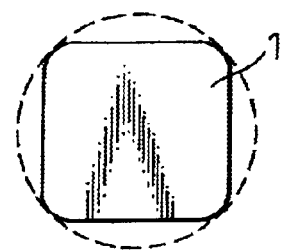
Figure 22D:
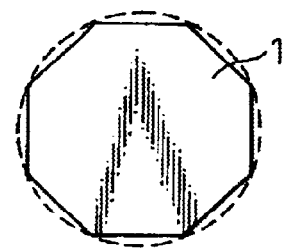
Figure 22E:
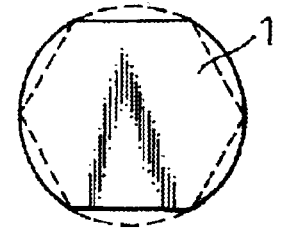
Figure 22F:
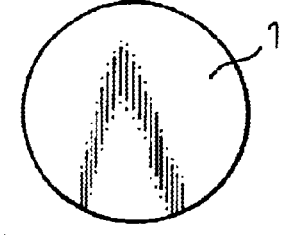

An insulating film 6 having a thickness of 0.002 to 0.5 mm is formed on the surface of the entire side surface of the piezoelectric device 1 in this embodiment, too, as illustrated in FIG. 21. The difference of the maximum outer diameter R1 of the piezoelectric device 1 inclusive of the insulating member 6 and the inner diameter R2 of the cylindrical case, that is, R2−R1, is set to 0.5 mm or below.

The rest of the constructions are the same as those of the first embodiment.

As described above, the piezoelectric device 1 according to this embodiment is accommodated in the cylindrical case 4 and its sectional shape is octagonal. Therefore, in comparison with the polygonal shapes having a smaller number of corners than the octagonal shape, such as the rectangular or hexagonal shape, the sectional area of the piezoelectric device 1 can be much more increased and the accommodation space can be more effectively utilized. In consequence, the force generation of the piezoelectric device 1 can be increased, too.

Since the sectional shape is octagonal, the angle at each corner is greater than that of other polygonal shapes having a smaller number of corners, and proximity between the piezoelectric device 1 and the cylindrical case 4 encircling the former increases. In other words, the number of portions having a smaller distance between the piezoelectric device 1 and the cylindrical case 4 increases or, the space decreases, and heat can be more efficiently transferred from the piezoelectric device 1 to the cylindrical case 4. Consequently, when the piezoelectric device 1 generates heat, this heat can be easily radiated from the cylindrical case, and the temperature rise of the piezoelectric device 1 can be suppressed.

This embodiment can exhibit the function and effect similar to that of the fifth embodiment.

Embodiment 7

This embodiment prepares six kinds of piezoelectric devices 1 having the same basic structure as that of the first embodiment but mutually different in only the sectional shape. The temperature rise due to self-exothermy is measured, and durability estimated from the measurement result is evaluated.

As shown in FIGS. 22A–22F and Table 4, the sectional shapes of the piezoelectric devices (samples 1 to 6) are barrel-shape and circles based on a square, a regular hexagon, a square with arcuate corners (R-chamfering of a square), an octagon and a regular hexagonal, respectively. Each sectional area ratio represents the value with the value of the circle as 1.0. Incidentally, the polygon of the section need not be a regular polygon but may be an arbitrary shape.

To measure the temperature rise due to self-exothermy, each piezoelectric device is driven at an applied voltage of 0 to 1.5 kV/mm and a frequency of 200 Hz, and the temperature of the side surface at the center in the laminating direction is measured.

Table 4 shows the result. It can be appreciated from Table 4 that in the samples 3 to 6 in which the sectional shape is a polygon greater than the octagon or at least a part of the section is arcuate, the temperature rise due to self-exothermy can be suppressed to 100° C. or below. In contrast, in the samples whose sectional shapes are square and hexagonal, the temperature rise exceeding 100° C. can be observed. It can be estimated from the temperature rise, etc, that when a durability test for operating $1 \times 10^9$ times the piezoelectric device is conducted, the samples 3 to 6 pass the test (◯) and exhibit high durability, whereas the samples 1 and 2 cannot pass the test (X) and the improvement in durability cannot be observed.

TABLE 4

| sample | sectional shape | sectional area ratio | temperature rise (C.) | durability |
|---|---|---|---|---|
| 1 | square | 0.64 | 112 | X |
| 2 | hexagon | 0.83 | 108 | X |
| 3 | square R-chamfering | 0.92 | 92 | ◯ |
| 4 | octagon | 0.90 | 95 | ◯ |
| 5 | barrel (based on hexagon) | 0.94 | 90 | ◯ |
| 6 | circle | 1.00 | 88 | ◯ |

Embodiment 8

In this embodiment, the result of the seventh embodiment is examined in relation with the proximity ratio.

Table 5 shows the proximity ratio of each sample.

This proximity ratio is expressed by (B/A)×100 (%) where A is the length of the entire circumference of the circumscribed circle of the piezoelectric device 1 and B is the total length of the circumferential portions that have a distance of not greater than 0.2 mm from the circumscribed circle.

The proximity ratio will be further explained with reference to FIG. 23.

Figure 23:
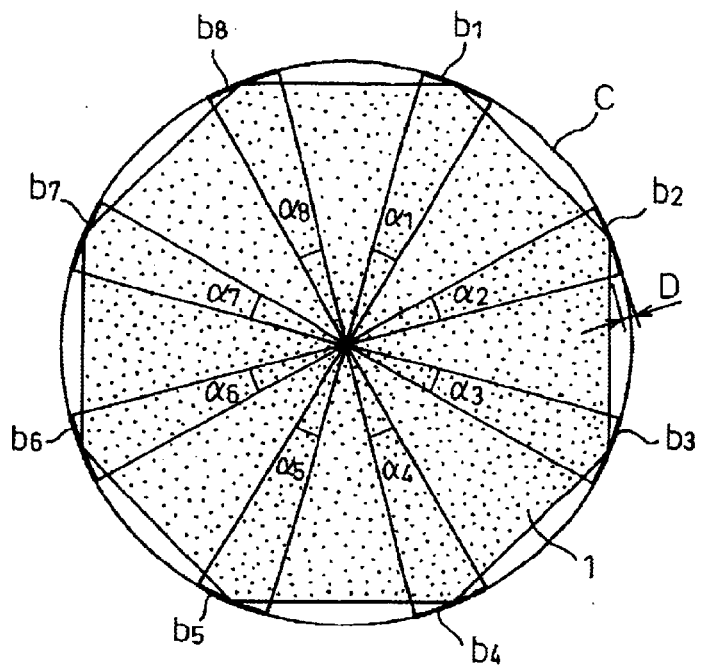
FIG. 23 is an explanatory view showing a method of calculating a proximity ratio in the fourth embodiment.

FIG. 23 shows the case where the piezoelectric device 1 has an octagonal shape by way of example. The portions having a distance D of not greater than 0.2 mm between the circumscribed circle C and the piezoelectric device 1 are represented by sold line portions $b_1$ to $b_8$ in the circumscribed circle, and the sum of the length of these arcs is B. The length $b_n$ of each arc can be expressed by $b_n = \alpha_n r$ where $\alpha_n$ is its center angle and r is the radius of the circumscribed circle C.

On the other hand, the length A of the entire circumference of the circumscribed circle C is $2\pi r$ as is well known.

Therefore, to determine the proximity ratio in practice, it can be calculated from:

$$(B/A) \times 100 = ((\alpha_1 r + \alpha_2 r \ldots + \alpha_8 r)) \times 100,$$

that is, $$(B/A) \times 100 = ((\alpha_1 + \alpha_2 \ldots + \alpha_8)/2\pi) \times 100$$

It can be appreciated from Table 5 that the temperature rise due to self-exothermy can be suppressed to 100° C. or below in all of the samples 3 to 6 having a proximity ratio of at least 32%. In contrast, the temperature rise exceeding 100° C. can be observed when the proximity ratio is not greater than 17%. It can thus be estimated from the temperature rise of the samples that when the proximity ratio exceeds 32%, excellent durability can be acquired and when the proximity ratio is 17% or below, the improvement in durability cannot be expected.

TABLE 5

| sample | sectional shape | proximity ratio | temperature rise (° C.) | durability |
|---|---|---|---|---|
| 1 | square | 10% | 112 | X |
| 2 | hexagonal | 17% | 108 | X |
| 3 | square R-chamfering | 32% | 92 | ○ |
| 4 | octagonal | 36% | 95 | ○ |
| 5 | barrel-shaped (based on hexagon) | 45% | 90 | ○ |
| 6 | circle | 100% | 88 | ○ |

Embodiment 9

This embodiment concretely represents the electrode take-out portion to the piezoelectric device 1 in the fifth embodiment.

The most ordinary method directly disposes the electrode take-out portions to the external electrodes 31 and 32 formed on the side surfaces 101 and 102 of the piezoelectric device 1. This embodiment particularly disposes the electrode take-out portions 315 and 316 electrically connected to the internal electrode layers 21 and 22 at the distal end face and the rear end face of the piezoelectric device 1 in the laminating direction, respectively.

Figure 24A:
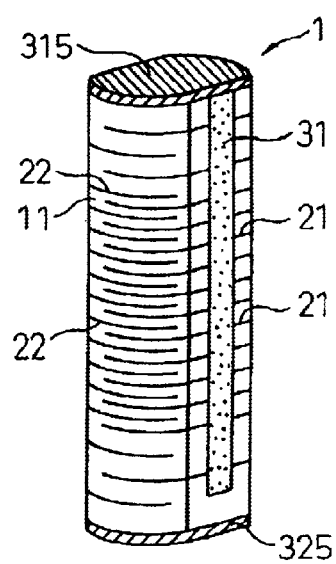
FIG. 24A is a perspective view of a piezoelectric device in a fifth embodiment and FIG. 24B is its longitudinal sectional view.
Figure 24B:
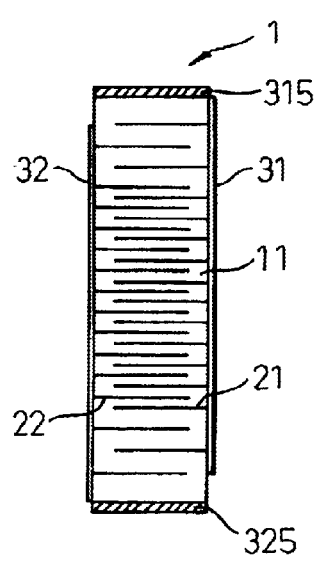

In the piezoelectric device 1 shown in FIGS. 24A and 24B, the external electrode 31 disposed on the side surface 101 on the right side and the upper electrode take-out portion 315 are brought into mutual contact and are electrically connected. On the other hand, the external electrode 32 disposed on the side surface on the left side and the lower electrode take-out portion 325 are brought into mutual contact and are electrically connected.

Figure 25A:
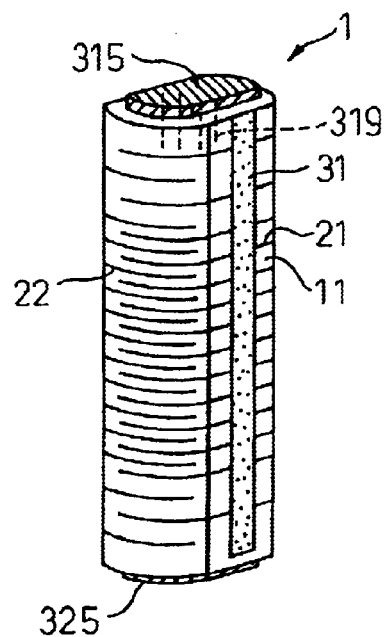
FIG. 25A is a perspective view of another piezoelectric device in the fifth embodiment and FIG. 25B is its longitudinal sectional view.
Figure 25B:
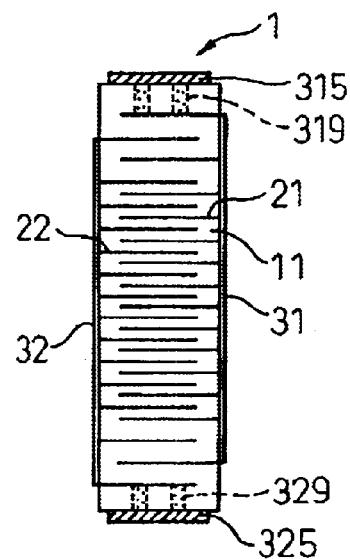

In the piezoelectric device 1 shown in FIGS. 25A and 25B, the area of each electrode take-out portion 315, 325 is smaller than the area of each of the distal and rear end faces of the piezoelectric device 1, and the electrode take-out portion 315, 325 and the corresponding internal electrode layer 21, 22 are electrically connected with one another through a through-hole 319, 329 formed inside the piezoelectric device 1.

In the examples shown in FIGS. 24A and 24B, and FIGS. 25A and 25B, the electrode take-out portions 315 and 325 are disposed on the distal end face and the rear end face of the piezoelectric device 1 in the laminating direction. In this case, the overall structure of the piezoelectric device 1 can be simplified and the production cost can be lowered.

Embodiment 10

This embodiment concretely represents another example of the electrode take-out portions to the piezoelectric device in the first embodiment.

In this embodiment, two electrode take-out portions 315 and 325 electrically connected to the internal electrode layers 21 and 22 are disposed on either one of the distal end face and the rear end face of the piezoelectric device 1 in the laminating direction (the upper end face in the drawings).

Figure 26A:
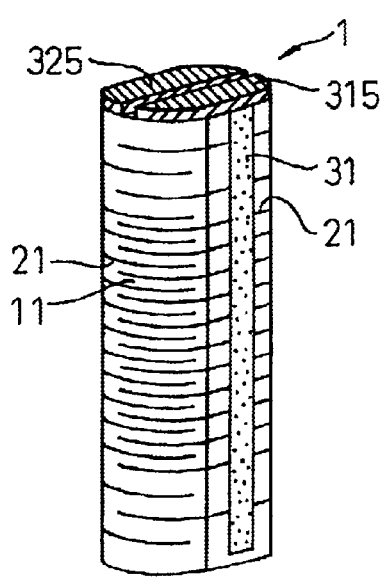
FIG. 26A is a perspective view of a piezoelectric device in a sixth embodiment and FIG. 26B is its longitudinal sectional view.
Figure 26B:
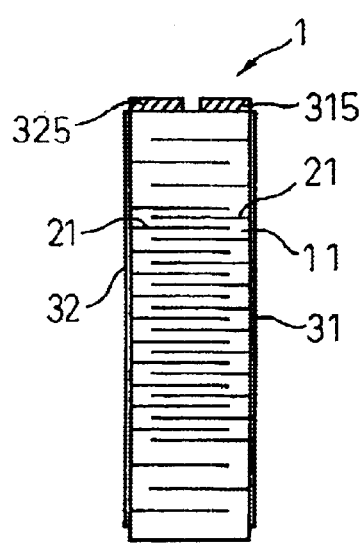

In the piezoelectric device 1 shown in FIGS. 26A and 26B, two electrode take-out portions 315 and 325 are disposed in the spaced-apart relation with each other on the distal end face of the piezoelectric device 1 in the laminating direction (the upper end face in the drawings). In other words, the external electrode 31 disposed on the side surface 101 of the piezoelectric device 1 on the right side and the upper electrode take-out portion 315 on the right side are brought into mutual contact and are electrically connected. On the other hand, the external electrode 32 disposed on the side surface 102 on the left side and the upper electrode take-out portion 325 on the left side are brought into mutual contact and are electrically connected.

Figure 27A:
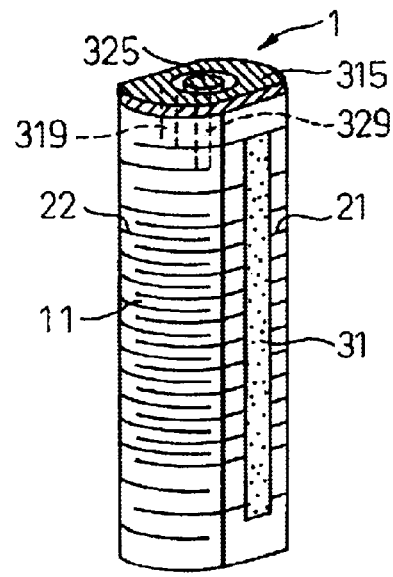
FIG. 27A is a perspective view of another piezoelectric device in the sixth embodiment and FIG. 27B is its longitudinal sectional view.
Figure 27B:
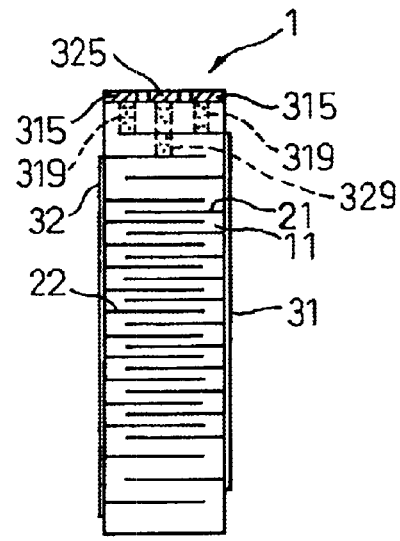

In the piezoelectric device 1 shown in FIGS. 27A and 27B, two electrode take-out portions 315 and 325 are disposed in a double circle. The electrode take-out portion 315 and the internal electrode layer 21 are electrically connected with each other through a through-hole 319, and the electrode take-out portion 325 and the internal electrode layer 22 are electrically connected with each other through a through-hole 329.

Figure 28A:
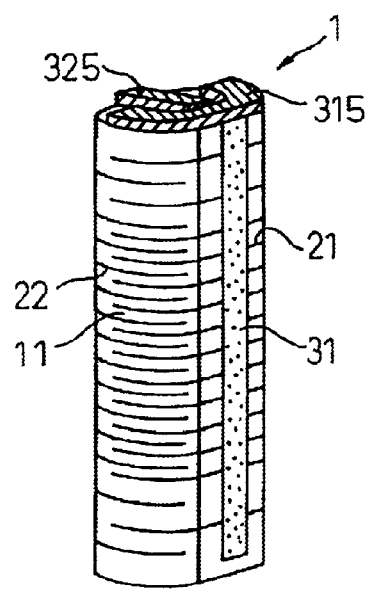
FIG. 28A is a perspective view of still another piezoelectric device in the sixth embodiment and FIG. 28B is its longitudinal sectional view.
Figure 28B:
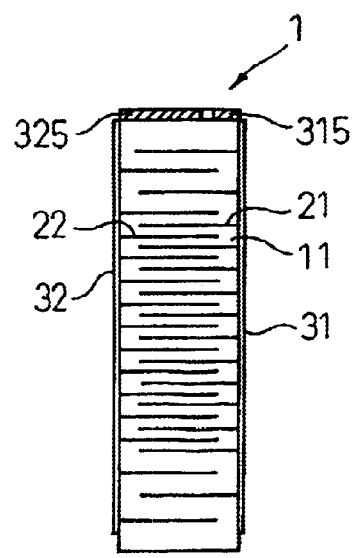

In the piezoelectric device 1 shown in FIGS. 28A and 28B, the shape of the electrode take-out portions 315 and 325 shown in FIGS. 26A and 26B is changed. In other words, one 315 of the electrode take-out portion has a C shape and is so disposed as to encompass the other electrode take-out portion 325. The rest of the constructions are the same as those of FIGS. 26A and 26B.

In the examples shown in FIGS. 26A and 26B to 28A and 28B, two electrode take-out portions 315 and 325 are disposed on either one of the distal end face and the rear end face of the piezoelectric device 1 in the laminating direction. In this case, too, the overall structure of the piezoelectric device 1 can be simplified and the production cost can be lowered.

Embodiment 11

In this embodiment, the piezoelectric device 1 in the fifth embodiment is disposed inside the injector 5 without being sealed into the circularly cylindrical case 4.

Figure 29:
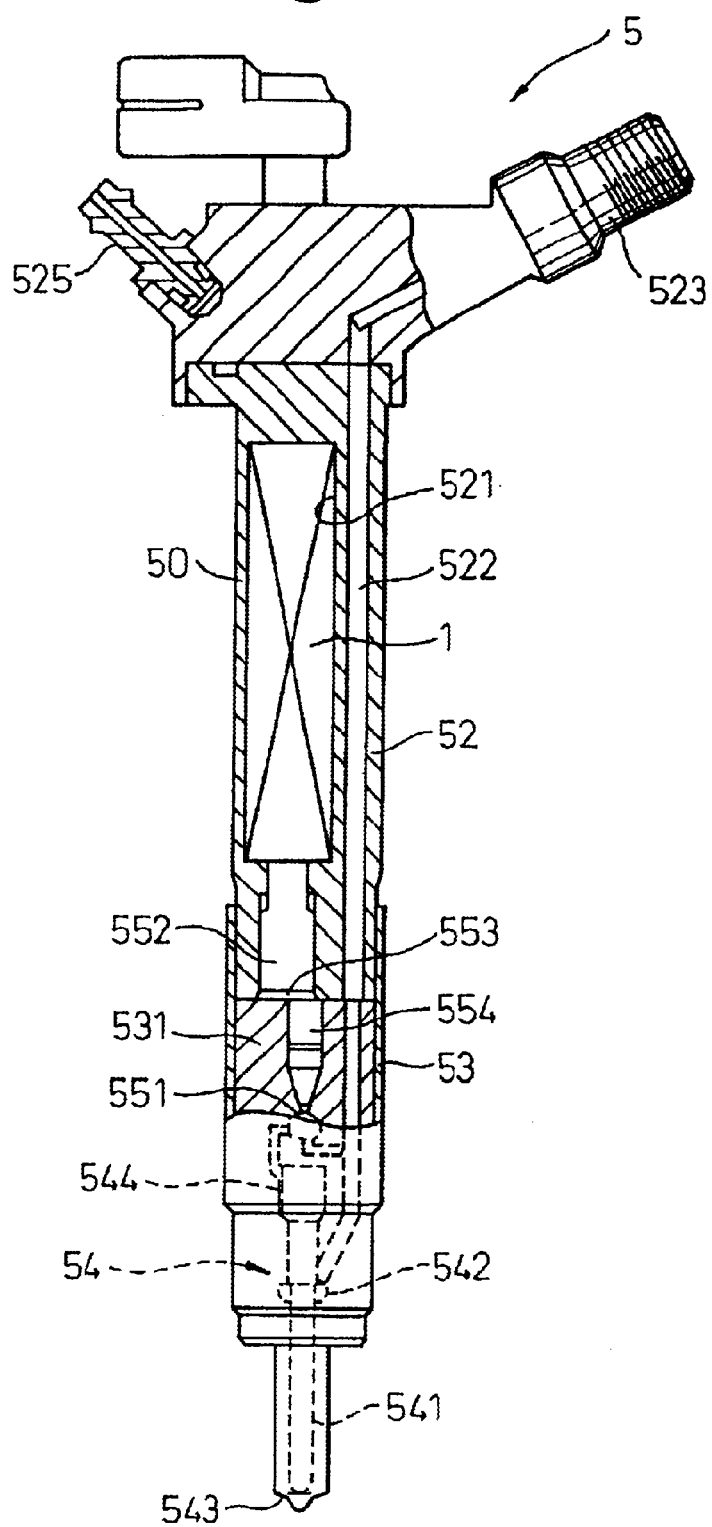
FIG. 29 is an explanatory view showing the structure of an injector in a seventh embodiment.

In other words, the housing 52 itself of the injector 5 has a cylindrical accommodation space as shown in FIG. 29. The fuel passage is disposed at a portion separate from the cylindrical accommodation space. The rest of the basic structures are the same as those of the injector 5 of the first embodiment. In this case, too, the function and effect substantially similar to that of the fifth embodiment can be obtained.

What is claimed is:

1. A piezoelectric device for an injector, built into an injector and generating driving force of said injector, comprising:

a plurality of piezoelectric layers generating displacement in proportion to a voltage applied to said piezoelectric layers;

a plurality of internal electrode layers for supplying the voltage; and said piezoelectric layers and said internal electrode layers being alternately laminated;

the composition of said piezoelectric layers being a lead zirco-titanate composition, the components of said lead zirco-titanate composition being adjusted so that a relation d(0.1 Ec)/(1.2 Ec)>0.43 is established, where Ec is coercive electric field which causes the changing of polarizing direction, between an apparent piezoelectric constant d(1.2 Ec) calculated from static elongation when an electric field of 1.2 Ec is applied to said piezoelectric device in the same direction as a polarizing direction while a preset load of 500N is applied to said piezoelectric device, and an apparent piezoelectric constant d(0.1 Ec) calculated from static elongation when an electric field of 0.1 Ec is applied to said piezoelectric device in the same direction as the polarizing direction.

2. A piezoelectric device for an injector according to claim 1, wherein the component of the lead zirco-titanate composition established a relation d(0.1 Ec)/d(1.2 Ec)≧0.5 between said piezoelectric constant d(1.2 Ec) and said piezoelectric constant d(0.1 Ec).

3. A piezoelectric device for an injector, built into an injector and generating driving force of said injector, comprising:
a plurality of piezoelectric layers generating displacement in proportion to a voltage applied to said piezoelectric layers;
a plurality of internal electrode layers for supplying the applied voltage; and
said piezoelectric layers and said internal electrode layers being alternately laminated;
the composition of said piezoelectric layers being a lead zirco-titanate composition, the components of said lead zirco-titante composition being adjusted so that said piezoelectric device has a change ratio of displacement of 9% or below when a frequency of the applied voltage is changed from 1 Hz to 200 Hz under the state where an AC voltage is applied so that an electric field intensity of 0 to 1.5 kV/mm is generated by a sine wave while a preset load of 500N is applied to said piezoelectric device.

4. A piezoelectric device for an injector according to claim 3, wherein said change ratio of displacement is 7% or below.

5. A piezoelectric device for an injector, built in an injector and generating driving force of said injector, comprising:
a plurality of piezoelectric layers generating displacement in proportion to a voltage applied to said piezoelectric layers;
a plurality of internal electrode layers for supplying the applied voltage; and
said piezoelectric layers and said internal electrode layers being alternately laminated;
the composition of said piezoelectric layers being a lead zirco-titante composition, the components of said lead zirco-titante composition being adjusted so that the displacement increases with the rise of temperature within the range of −40° C. to 150° C.

6. A piezoelectric device for an injector according to claim 5, wherein the components of the lead zirco-titante composition is adjusted so that said change ratio of displacement 5 to 40% within the range of temperature of −40° C. to 150° C.

7. A piezoelectric device for an injector, built in an injector and generating driving force of said injector, comprising:
a plurality of piezoelectric layers generating displacement in proportion to a voltage applied to said piezoelectric layers;
a plurality of internal electrode layers for supplying the applied voltage; and
said piezoelectric layers and said internal electrode layers being alternately laminated;
the composition of said piezoelectric layers being a lead zirco-titante composition, the components of said lead zirco-titanate composition being adjusted so that said piezoelectric devices has a dielectric loss of 8% or below calculated from a P-E hysteresis.

8. A piezoelectric device for an injector according to claim 7, wherein the components of said lead zirco-titante composition being adjusted such that said dielectric loss is 7% or below.

9. A method of a piezoelectric device to generate driving force of an injector, the piezoelectric device having a plurality of piezoelectric layers and a plurality of internal electrode layers, the method comprising:
applying a voltage to the plurality of internal electrode layers;
generating displacement in the piezoelectric layers in proportion to the applied voltage; and
establishing a relation d(0.1 Ec)/d(1.2 Ec)>0.43, where Ec is coercive electric field which causes the changing of polarizing direction, between an apparent piezoelectric constant d(1.2 Ec) calculated from static elongation when an electric field of 1.2 Ec is applied to said piezoelectric device in the same direction as a polarizing direction while a preset load of 500 N is applied to said piezoelectric device, and an apparent piezoelectric constant d(0.1 Ec) calculated from static elongation when an electric field of 0.1 Ec is applied to said piezoelectric device in the same direction as the polarizing direction.

10. A method according to claim 9, wherein a relation d(0.1 Ec)/d(1.2 Ec)≧0.5 is established between said piezoelectric constant d(1.2 Ec) and said piezoelectric constant d(0.1 Ec).

11. A method of using a piezoelectric device to generate a driving force of an injector, the piezoelectric device having a plurality of piezoelectric layers and a plurality of internal electrode layers, the method comprising:
applying a voltage to the plurality of internal electrode layers;
generating displacement in the piezoelectric layers in proportion to the applied voltage; and
wherein said piezoelectric device has a change ratio of displacement of 9% or below when a frequency of the applied voltage is changed from 1 Hz to 200 Hz under the state where an a frequency of the applied so that an electric field intensity of 0 to 1.5 kV/mm is generated by a sine wave while a preset load of 500 N is applied to said piezoelectric device.

12. A method according to claim 11, wherein said change ratio of displacement is 7% or below.

13. A method of using a piezoelectric device to generate a driving force of an injector, the piezoelectric device having a plurality of piezoelectric layers and a plurality of internal electrode layers, the method comprising:
applying a voltage to the plurality of internal electrode layers; and
generating displacement in the piezoelectric layers in proportion to the applied voltage;
wherein the displacement increases with the rise of temperature within the range of −40° C. to 150° C.

14. A method according to claim 13, wherein said change ratio of displacement is 5 to 40% within the range of temperature of −40° C. to 150° C.

15. A method of using a piezoelectric device to generate a driving force of an injector, the piezoelectric device having a plurality of piezoelectric layers and a plurality of internal electrode layers, the method comprising:

applying a voltage to the plurality of internal electrode layers; and generating displacement in the piezoelectric layers in proportion to the applied voltage;

wherein said piezoelectric device has dielectric loss of 8% or below calculated from a P-E hysteresis.

16. A method according to claim 15, wherein the dielectric loss is 7% or below.

* * * * *